(12) United States Patent
Suehiro et al.

(10) Patent No.: US 8,017,967 B2
(45) Date of Patent: Sep. 13, 2011

(54) LIGHT-EMITTING ELEMENT INCLUDING A FUSION-BONDING PORTION ON CONTACT ELECTRODES

(75) Inventors: Yoshinobu Suehiro, Aichi-ken (JP); Masayoshi Ichikawa, Aichi-ken (JP); Satoshi Wada, Aichi-ken (JP); Koji Tasumi, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 227 days.

(21) Appl. No.: 12/155,820

(22) Filed: Jun. 10, 2008

(65) Prior Publication Data

US 2008/0252212 A1 Oct. 16, 2008

Related U.S. Application Data

(62) Division of application No. 11/220,405, filed on Sep. 7, 2005, now Pat. No. 7,417,220.

(30) Foreign Application Priority Data

Sep. 9, 2004 (JP) ................................ 2004-263097
Oct. 29, 2004 (JP) ................................ 2004-316007

(51) Int. Cl.
    *H01L 33/00* (2010.01)

(52) U.S. Cl. .......... 257/99; 257/734; 257/778; 257/781; 257/E33.066; 438/29; 438/597

(58) Field of Classification Search .................. None
    See application file for complete search history.

(56) References Cited

U.S. PATENT DOCUMENTS

| 4,316,208 | A | | 2/1982 | Kobayashi et al. | |
|---|---|---|---|---|---|
| 5,578,162 | A | * | 11/1996 | D'Asaro et al. | 257/85 |
| 5,895,231 | A | * | 4/1999 | Choi et al. | 438/106 |
| 6,194,743 | B1 | * | 2/2001 | Kondoh et al. | 257/94 |
| 6,331,450 | B1 | * | 12/2001 | Uemura | 438/114 |
| 6,474,531 | B2 | * | 11/2002 | Ozawa | 228/103 |
| 6,521,478 | B2 | * | 2/2003 | Chen | 438/106 |
| 6,573,537 | B1 | | 6/2003 | Steigerwald et al. | |
| 6,693,352 | B1 | * | 2/2004 | Huang et al. | 257/743 |
| 6,784,463 | B2 | * | 8/2004 | Camras et al. | 257/99 |
| 6,921,928 | B2 | | 7/2005 | Sonobe | |

(Continued)

FOREIGN PATENT DOCUMENTS

JP        54-006787        1/1979

(Continued)

OTHER PUBLICATIONS

Japanese Office Action dated Sep. 9, 2008 with Partial English-Language Translation.

(Continued)

*Primary Examiner* — Thanh V Pham
*Assistant Examiner* — Andres Munñoz
(74) *Attorney, Agent, or Firm* — McGinn IP Law Group, PLLC

(57) ABSTRACT

A solid-state device having: a flip-chip mounted solid-state element; a power receiving/feeding portion having a mounting substrate to allow that a mounting surface of the solid-state element forms substantially the same plane as a surface of the mounting substrate; and an inorganic sealing portion made of an inorganic sealing material having a thermal expansion coefficient equal to that of the power receiving/feeding portion for sealing the solid-state element.

7 Claims, 18 Drawing Sheets

U.S. PATENT DOCUMENTS

| | | | |
|---|---|---|---|
| 6,946,685 B1 * | 9/2005 | Steigerwald et al. | 257/94 |
| 7,067,340 B1 * | 6/2006 | Tsai et al. | 438/47 |
| 7,335,523 B2 * | 2/2008 | Liu et al. | 438/29 |
| 2003/0011077 A1 | 1/2003 | Morishima et al. | |
| 2003/0222270 A1 * | 12/2003 | Uemura | 257/99 |
| 2004/0041222 A1 | 3/2004 | Loh | |
| 2004/0046242 A1 | 3/2004 | Asakawa | |
| 2004/0149999 A1 * | 8/2004 | Uemura et al. | 257/103 |
| 2004/0164310 A1 * | 8/2004 | Uemura | 257/99 |
| 2004/0166661 A1 * | 8/2004 | Lei | 438/614 |
| 2004/0195579 A1 | 10/2004 | Sonobe | |
| 2004/0237299 A1 | 12/2004 | Stelzl et al. | |
| 2005/0009244 A1 | 1/2005 | Shiobara et al. | |
| 2006/0012299 A1 | 1/2006 | Suehiro et al. | |
| 2006/0027934 A1 | 2/2006 | Edelstein et al. | |
| 2006/0091541 A1 | 5/2006 | Bojkov et al. | |
| 2006/0261364 A1 | 11/2006 | Suehiro et al. | |
| 2007/0096312 A1 | 5/2007 | Humpston et al. | |
| 2007/0187666 A1 * | 8/2007 | Watanabe et al. | 257/13 |

FOREIGN PATENT DOCUMENTS

| | | |
|---|---|---|
| JP | 62-173744 | 7/1987 |
| JP | 04-163972 | 6/1992 |
| JP | 07-030153 | 1/1995 |
| JP | 8-102553 | 4/1996 |
| JP | 09-008361 | 1/1997 |
| JP | 10-031434 | 2/1998 |
| JP | 10-256309 | 9/1998 |
| JP | 11-008414 | 1/1999 |
| JP | 11-177129 | 7/1999 |
| JP | 11-220167 | 8/1999 |
| JP | 2000-091628 | 3/2000 |
| JP | 2000-294837 | 10/2000 |
| JP | 2001-237458 | 8/2001 |
| JP | 2002-9427 | 1/2002 |
| JP | 2003-243718 | 8/2003 |
| JP | 2004-006991 | 1/2004 |
| JP | 2004-039691 | 2/2004 |
| JP | 2004-082036 | 3/2004 |
| JP | 2004-193457 | 7/2004 |
| WO | 2004/082036 | 9/2004 |

OTHER PUBLICATIONS

Japanese Office Action dated Mar. 3, 2009 with Partial English Translation.

Japanese Office Action dated Sep. 2, 2008 with Partial English Translation.

Japanese Office Action dated Jul. 14, 2009 with Partial English Translation.

Questioning dated Jul. 13, 2010 (with partial English translation).

* cited by examiner

LIGHT-EMITTING ELEMENT INCLUDING A FUSION-BONDING PORTION ON CONTACT ELECTRODES The present Application is a Divisional Application of U.S. patent application Ser. No. 11/220,405 filed on Sep. 7, 2005 now U.S. Pat. No. 7,417,220.

The present application is based on Japanese patent application Nos. 2004-263097 and 2004-316007, the entire contents of which are incorporated herein by reference.

BACKGROUND OF THE INVENTION

1. Field of the Invention

The present invention relates to a solid state device, and particularly, to a solid state device which is sealed with a sealing material made of low melting point glass.

The present invention also relates to a light-emitting element made of a semiconductor material and a light-emitting device using the light-emitting element, and particularly, to a light-emitting element and a light-emitting device which are flip-chip mounted.

Herein, a solid state device includes various optical devices or elements such as a light-emitting device or element, a light-receiving device or element, and a solar cell. Also, herein, a light-emitting element includes an LED element, and a light-emitting device includes an LED.

2. Description of the Related Art

Conventionally, there are solid state devices with a solid state component such as a light-emitting diode (LED), or the like, sealed with a light-transmitting resin material such as epoxy resin, or the like. It is known that in such solid state devices, light-transmitting resin is degraded by light. Particularly, in the case of use of group III nitride-based compound semiconductor light-emitting elements which emit short-wavelength light, light-transmitting resin around the elements is caused to turn yellow by high-energy light emitted from the elements and heat produced by the elements themselves, which often unnegligibly degrades efficiency of deriving light.

To prevent degradation of such sealing materials, there have been proposed light-emitting devices using low melting point glass as sealing material (See Japanese patent application laid-open Nos. 8-102553, and 11-177129, for example).

The light-emitting device of Japanese patent application laid-open No. 8-102553 is constructed by covering an LED element, wire bonding portions, and upper ends of leads, with a transparent sealing material made of low melting point glass. In the low melting point glass, there is used glass whose melting point is 130-350° C. by adding thereto selenium, thallium, arsenic, sulfur, etc., for example. In this case, there is used low melting point glass whose melting point is preferably 200° C. or less, more preferably 150° C. or less.

The light-emitting device of Japanese patent application laid-open No. 8-102553 uses a transparent sealing material made of low melting point glass, thereby obviating the problem with optical degradation with time of light-transmitting resin material due to ultraviolet rays.

On the other hand, the light-emitting device of Japanese patent application laid-open No. 11-177129 uses, as sealing material for covering its LED element, low melting point glass whose refractive index is on the order of 2 close to the refractive index of GaN-based LED elements, the order of 2.3.

The light-emitting device of Japanese patent application laid-open No. 11-177129 seals its LED element with low melting point glass whose refractive index is close to the refractive index of GaN-based LED elements, thereby lessening light totally reflected off the interface between the LED element and the low melting point glass, while increasing light radiated outwardly from the LED element and passed into the low melting point glass. As a result, the outward radiation efficiency becomes higher than that of conventional light-emitting devices with an LED element sealed with epoxy resin.

According to conventional solid state devices, however, because of high viscosity of conventional low melting point glass in a practical sealing temperature range, it is impossible to realize a solid state device having the sufficient sealing property when using a sealing material made of low melting point glass.

Conventionally, on the other hand, flip-chip mounting is known in which an LED element is electrically connected to a wiring pattern of a printed wiring board or the like through a stud bump of Au or the like.

In flip-chip mounting, a cathode and an anode on the LED element are connected to a wiring pattern via a stud bump, thus allowing mounting of the LED element without using pad electrodes and wires. In addition, light is radiated from the surface opposite the mounting surface, which thus allows excellent light-radiating performance without pad electrodes and wires blocking off light.

The above-mentioned flip-chip mounting requires arrangement of stud bumps according to the number of cathodes and anodes, and stable arrangement of the LED element requires 3 or more stud bumps. This requires time-consuming and costly bump formation. Particularly, in large-size LED elements, a plurality of stud bumps are arranged for multipoint joining, which can therefore be more significantly time-consuming and costly.

As a means for obviating time-consuming labor in such bump formation, there is a bump formation method in which a bump for mounting components is formed on the surface of a printed wiring board by plating (See Japanese patent application laid-open No. 2002-9427).

According to a bump formation method described in Japanese patent application laid-open No. 2002-9427, a resist film is formed by applying resist to the surface of a printed wiring board, using a spin coater or a printing method. The resist film formation is followed by light exposure using a mask having a mask window matching a desired position and shape of a bump. Next, an exposed portion is developed and dissolved by an immersion or spray method used in typical photoresist development to form an opening, followed by plating the opening and subsequently dissolving and removing the resist film, thereby forming a plurality of bumps for mounting components on the printed wiring board.

In the above-mentioned bump formation method, however, because the bumps for mounting components have to be formed by photolithography, the number of fabrication steps increases, which results in a high cost.

Further, it is required that the bumps for mounting components have high shape accuracy matching electrode shape of the light-emitting element, and that the light-emitting element be positioned accurately relative to the bumps for mounting components when mounting the light-emitting element.

SUMMARY OF THE INVENTION

It is an object of the present invention to provide a solid state device having the sufficient sealing property when using a sealing material made of low melting point glass.

It is a further object of the present invention to provide a solid state device which is excellent in solid state component packaging, sealing, electrical connection, and thermal dissipation.

It is a still further object of the present invention to provide an LED element and a light-emitting device, the packaging process of which can be simplified.

(1) According to a first aspect of the invention, a solid-state device comprises:

a flip-chip mounted solid-state element;

a power receiving/feeding portion comprising a mounting substrate to allow that a mounting surface of the solid-state element forms substantially the same plane as a surface of the mounting substrate; and an inorganic sealing portion made of an inorganic sealing material having a thermal expansion coefficient equal to that of the power receiving/feeding portion for sealing the solid-state element.

(2) According to a second aspect of the invention, a light-emitting element comprises:

p and n contact electrodes formed on a flip-chip mounting surface of the light-emitting element corresponding to one light-emitting layer of the light-emitting element; and a fusion-bonding portion formed on the p and n contact electrodes corresponding to the p and n contact electrodes, for being fusion-bonded to an external mounting pattern.

(3) According to a third aspect of the invention, a light-emitting device comprises:

a light-emitting element comprising on a flip-chip mounting surface a contact electrode which serves as a reflection mirror, and a fusion-bonding portion formed on the contact electrode;

a mounting substrate comprising an external mounting pattern fusion-bonded to the fusion-bonding portion; and a light-transmitting sealing portion for sealing the light-emitting element fusion-bonded to the mounting substrate.

(4) According to a fourth aspect of the invention, a light-emitting device comprises:

a light-emitting element comprising on a flip-chip mounting surface a contact electrode which serves as a reflection mirror;

a mounting substrate comprising a fusion-bonding portion fusion-bonded to the contact electrode; and a light-transmitting sealing portion for sealing the light-emitting element fusion-bonded to the mounting substrate.

According to the present invention, it is possible to realize a solid state device having the sufficient sealing property when using a sealing material made of low melting point glass.

According to the present invention, it is possible to provide a solid state device which is excellent in solid state component packaging, sealing, electrical connection, and thermal dissipation.

According to the LED element and the light-emitting device of the present invention, since in the element fabrication process the fusion-bonded portion is electrically connected to the n-side and p-side of the LED element so as to be formed integrally with the LED element, the mounting process can be simplified.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Embodiment 1

Figure 1:
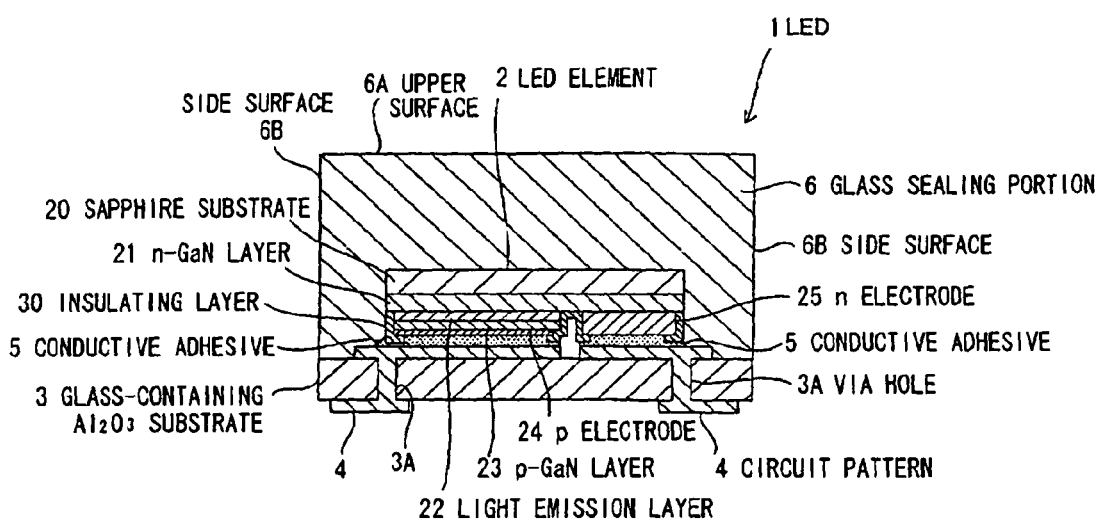
FIG. 1 is a cross-sectional view illustrating an LED as a solid state device according to a first embodiment of the invention.

FIG. 1 is a cross-sectional view illustrating an LED as a solid state device according to a first embodiment of the invention.

This LED 1 comprises a flip-chip-type LED element 2 made of a GaN-based semiconductor material (thermal expansion coefficient $\alpha$: 5–7 ($\times 10^{-6}/^\circ$C.)), a glass-containing $Al_2O_3$ substrate 3 as an inorganic material substrate for mounting the LED element 2, a circuit pattern 4 consisting of tungsten (W)-nickel (Ni)-gold (Au) and formed in the glass-containing $Al_2O_3$ substrate 3, a conductive adhesive 5 made of Ag paste for electrically connecting the circuit pattern 4 to a p-electrode 24 and an n-electrode 25 of the LED element 2, and a glass sealing portion 6 made of transparent glass bonded to the glass-containing $Al_2O_3$ substrate 3 for sealing the LED element 2. In this embodiment, the glass-containing $Al_2O_3$ substrate 3 and the circuit pattern 4 form a power receiving/feeding portion, and the joined surfaces of the p-electrode 24 and the n-electrode 25 of the LED element 2 are electrically connected to the surface of the circuit pattern 4 on substantially the same plane.

The LED element 2 is formed by sequential crystal growth of an n-GaN layer 21, a light-emitting layer 22 and a p-GaN layer 23, via an AlN buffer layer not shown, on the surface of a sapphire ($Al_2O_3$) substrate 20, and has the p-electrode 24 provided on the surface of the p-GaN layer 23, and the n-electrode 25 formed on the n-GaN layer 21 exposed by etching and removing the region extending from the p-GaN layer 23 to a portion of the n-GaN layer 21, where an insulating layer 30 is provided on the mounting surface for forming the p-electrode 24 and the n-electrode 25, except for portions for electrical connection. This LED element 2 is epitaxially grown at 700° C. or higher, and has a heat-resistant temperature of 600° C. or higher, and is stable at temperatures at which sealing is performed using low melting point glass, as will be described later. The p-electrode 24 is formed of rhodium Rh for also serving as a lower reflection mirror for reflecting light emitted from the light-emitting layer 22 in the direction of the sapphire substrate 20, and is 0.34 mm×0.34 mm×thickness 0.09 mm in size.

The glass-containing $Al_2O_3$ substrate 3 has a thermal expansion coefficient of $12.3\times10^{-6}/°$ C., and a plurality of via holes 3A. The metallized circuit pattern 4 on the front and back sides of the substrate is made electrically conductive through these via holes 3A. The circuit pattern 4 comprises a first conductive pattern formed on the LED element 2-mounting side, a second conductive pattern formed on its back side, and a third conductive pattern made of tungsten (W) for electrically interconnecting both the sides thereof.

The glass sealing portion 6 is formed of low melting point $P_2O_5$—ZnO—$Li_2O$-based glass (thermal expansion coefficient: $11.4\times10^{-6}/°$ C.,
yield point: 415° C., refractive index n: 1.59, internal transmittance: 99% (470 nm)), which is bonded to the glass-containing $Al_2O_3$ substrate 3 by hot pressing with a mold, and thereafter is formed in a rectangular shape having a top surface 6A and side surfaces 6B formed by dicer cutting.

The low melting point glass is processed with viscosity on several orders of magnitude higher than a viscosity level which is generally said to be high in resin. Also, in the case of glass, its viscosity cannot decrease to a general resin sealing level even if the glass is at temperatures exceeding its yield point by a few ten ° C. Also, attempts at viscosity levels during general resin molding require temperatures exceeding the crystal growth temperature of the LED element, or cause adhesion to a mold, which results in difficulty in sealing and molding. For this reason, the viscosity during processing is preferably $10^4$-$10^9$ poises.

The fabrication process for this LED 1 is explained below.

First, a glass-containing $Al_2O_3$ substrate 3 having via-holes 3A is prepared, and tungsten paste is screen-printed on the surface of the glass-containing $Al_2O_3$ substrate 3 according to a circuit pattern 4.

Next, the W-paste-printed glass-containing $Al_2O_3$ substrate 3 is heated at a little more than 1000° C., thereby burning W into the glass-containing $Al_2O_3$ substrate 3, followed by Ni and Au plating over W, which results in the formation of a circuit pattern 4.

Next, high-viscous Ag paste is screen-printed on the surface of the circuit pattern 4 of the glass-containing $Al_2O_3$ substrate 3 (on the element-mounting side) as a conductive adhesive 5. An LED element 2 is positioned relative to this Ag-paste-printed circuit pattern 4, and heated at 150° C., thereby hardening the Ag paste. The LED element 2 is mounted so that the mounting surfaces of its p-electrode 24 and n-electrode 25 are on substantially the same plane relative to the surface of the circuit pattern 4.

Next, a low melting point $P_2O_5$—ZnO—$Li_2O$-based glass board is set parallel to the LED-element-mounted glass-containing $Al_2O_3$ substrate 3, followed by hot pressing at a temperature of 500° C. in nitrogen atmosphere. The viscosity of the low melting point glass in this condition is $10^8$-$10^9$ poises, and the low melting point glass is bonded to the glass-containing $Al_2O_3$ substrate 3 via the oxides contained therein.

Next, the glass-containing $Al_2O_3$ substrate 3 integral with the low melting point glass is set and diced in a dicer into the LED 1 separately.

There may be used the LED element 2 formed by scribing. In this case, because the LED element 2 formed by scribing tends to have uneven side surfaces with protrusions that are cut portions, it is desired to coat the side surfaces of the LED element 2 with an element-coating material. As this element-coating material, there may be used an $SiO_2$-based coating material having light transmittance, for example. Use of an element-coating material allows preventing cracks and voids from occurring during resin overmolding, etc.

The effects of the first embodiment are as follows.

(1) Since the low melting point $P_2O_5$—ZnO—$Li_2O$-based glass is used and hot-pressed in a high viscous state, processing is possible at sufficiently low crystal growth temperatures, thus enhancing sealing.

(2) Since the glass-containing $Al_2O_3$ substrate 3 and the glass sealing portion 6 are chemically bonded to each other via the oxide, firm sealing bonding strength can be obtained. For that reason, glass sealing is materialized even in the case of small-size packages with small joining area.

(3) Since the sealing glass and the glass-containing $Al_2O_3$ substrate 3 have the same thermal expansion coefficient, after high temperature bonding, internal stress is small even at normal or low temperature, there is a less incidence of bonding failures of peeling, cracking, etc. In addition, glass tends to be caused to crack due to tensile stress, but has a less incidence of cracking due to compressive stress, so the thermal expansion coefficient of the sealing glass is made slightly small compared to the glass-containing $Al_2O_3$ substrate 3. The inventor has confirmed that no peeling and cracking occur even at 1000 cycles of $-40°$ C.$\leftrightarrow 100°$ C. liquid phase cold thermal shock tests. Also, as basic confirmation of bonding of a 5 mm square size glass piece to a ceramic substrate, experiments of combinations of various thermal expansivities of glass and ceramic substrate have verified that bonding is possible without cracking when the ratio of the low to high thermal expansion coefficient member is 0.85 or more. Although depending on the stiffness and size of the members, the same thermal expansion coefficient indicates this extent of range.

(4) Since no wire is required by flip-chip mounting, no malfunction of electrodes occurs in high viscous processing. Since the viscosity of the low melting point glass during sealing is as hard as $10^8$-$10^9$ poises which is significantly different in material properties compared to the order of 5 poises of liquid epoxy resin prior to thermal curing, no problems such as wire crushing and deformation occur when a face-up LED element is sealed in which electrodes on element surface and power-feeding members such as leads are electrically connected to each other by wires. Also, when a flip-chip LED element is sealed in which electrodes on element surface are flip-chip-joined to power-feeding members such as leads through a bump such as gold (Au), etc., it is possible to prevent bump crushing and a short-circuit between bumps due to pressure acting on the LED element in the direction of the power-feeding members according to the viscosity of glass.

(5) Since the low melting point glass and the glass-containing $Al_2O_3$ substrate 3 are set parallel to each other and hot-pressed in a high viscous state, so as to move the low melting point glass parallel to the surface of the glass-containing $Al_2O_3$ substrate 3 and bring it into close contact therewith, no void occurs in sealing the GaN-based LED element 2.

(6) Since the circuit pattern 4 of the glass-containing $Al_2O_3$ substrate 3 is drawn out to the backside at the via-holes 3A, there is no need of taking a particular action for preventing glass from penetrating into unwanted portions, from covering electrical terminals, and so on, thereby allowing the simplifying of the fabrication process. Also, since a plurality of devices are collectively sealed with the low melting point glass board, a plurality of LEDs 1 can easily be mass-produced by dicer cutting. Since the low melting point glass is processed in a high viscous state, without any need of taking a sufficient action as in resin, it is sufficiently possible to treat mass-production even without via-holes, provided that external terminals are drawn out to the backside (7) Since the GaN-based LED element 2 is flip-chip mounted, there are also the effects of being capable of overcoming the problems in materializing glass sealing, and of materializing 0.5 mm-square ultra-small-size LED 1. This is because no wire boding space is required, and no interface peeling occurs even in bonding in a small space by selecting the glass sealing portion 6 and the glass-containing $Al_2O_3$ substrate 3 with the same thermal expansion coefficient and by firm chemical bonding.

(8) Since the LED element 2 is mounted so that the mounting surfaces of its p-electrode 24 and n-electrode 25 are on substantially the same plane relative to the surface of the circuit pattern 4, high-viscous glass cannot penetrate between the LED element 2 and the circuit pattern 4, thus allowing the prevention of a decrease in electrical connection characteristics and of cracking due to glass penetration, and thereby enhancing the mounting property.

(9) Since the ratio of the mounting area to the element area of the LED element 2 is large, thermal dissipation can be enhanced and temperature irregularity can be prevented in the LED element 2. Also, since electrical connection characteristics are enhanced by enlarged conductive area, it is possible to sufficiently treat large light amount and high power of the LED 1.

(10) Since portions other than the mounting surfaces of the LED element 2 are covered with the insulating layer 30, it is possible to prevent leak current from flowing through the portions other than the mounting surfaces of the LED element 2 even in the event of Ag paste adhesion thereto.

In the first embodiment, although Ag paste is used as the conductive adhesive 5, there may be used any conductive adhesive 5 other than Ag paste, which has material properties that do not lose the mounting property of the LED element 2 due to pressure exertion during glass sealing.

Also, if applicable to flip-chip mounting, any type of LED element may be used other than the GaN-based LED element 2. Also, as an optical element other than the LED element, there may be used a light-receiving element.

Embodiment 2

Figure 2:
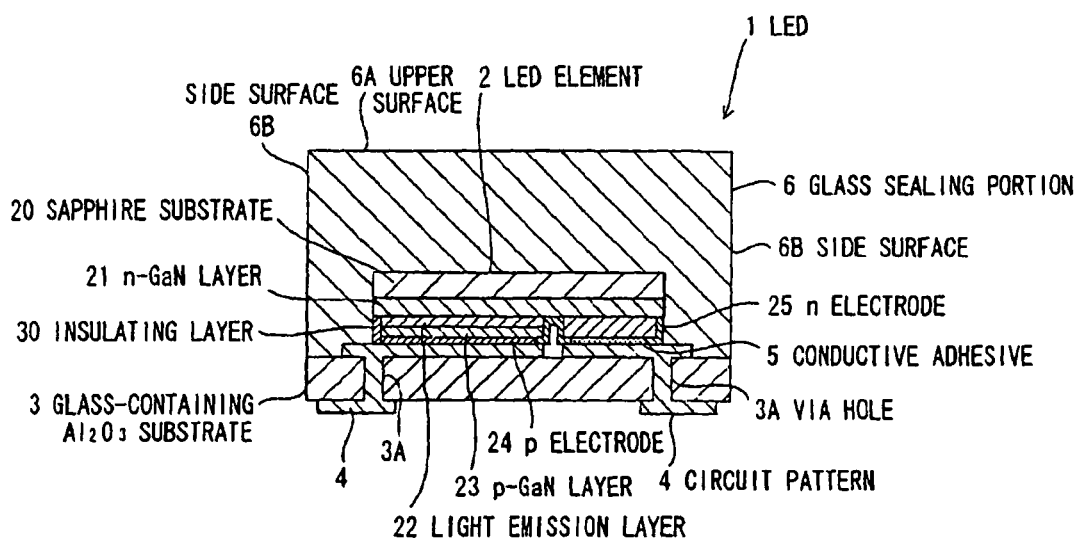
FIG. 2 is a cross-sectional view illustrating an LED as a solid state device according to a second embodiment of the invention.

FIG. 2 is a cross-sectional view illustrating an LED as a solid state device according to a second embodiment of the invention. In the following embodiments, the same reference numbers as those of the first embodiment respectively denote the portions having the same structure and function as those in the first embodiment.

This LED 1 is different from that of the first embodiment in screen-printing high viscous Ag paste as the conductive adhesive 5 on a portion positioned on the n-electrode 25 of the LED element 2 explained in the first embodiment, and bringing the p-electrode 24 into close contact with the circuit pattern 4 directly without Ag paste therebetween.

The effects of the second embodiment are as follows.

(1) Since no internal stress occurs in glass at high temperatures during glass processing, but glass contracts as cooled, which causes compression stress from the glass sealing portion 6 and the sapphire substrate 20 to the LED element 2, the element-mounting surface of the p-electrode 24 comes into close contact with the mounting surface of the circuit pattern 4 on substantially the same plane. This allows excellent-reliability electrical connection to be obtained without using Ag paste.

In flip-chip mounting using an Au-stud bump with epoxy resin and silicon resin, breaking can often be caused by tensile stress of the resin in solder reflow furnace treatment. This is because the resin with larger thermal expansion coefficient than that of the LED element 2 expands relatively more in higher-temperature atmosphere than resin-curing temperature. In contrast, in the solid state device of the invention, even in lead-free solder reflow furnace atmosphere on the order of 300° C., which is lower than glass sealing temperature, compression stress therefore continues to act on the LED element 2, which results in no breaking.

Here, if no position shift of the LED element 2 occurs relative to the circuit pattern 4, glass sealing may be performed with low melting point glass by arranging the n-electrode 25 at a specified position on the circuit pattern 4 without fixing the n-electrode 25 with Ag paste. Also, even in the case of positioning by bonding, portions other than the mounting surfaces may be temporarily bonded with not conductive but thermal resistive adhesive Embodiment 3

Figure 3:
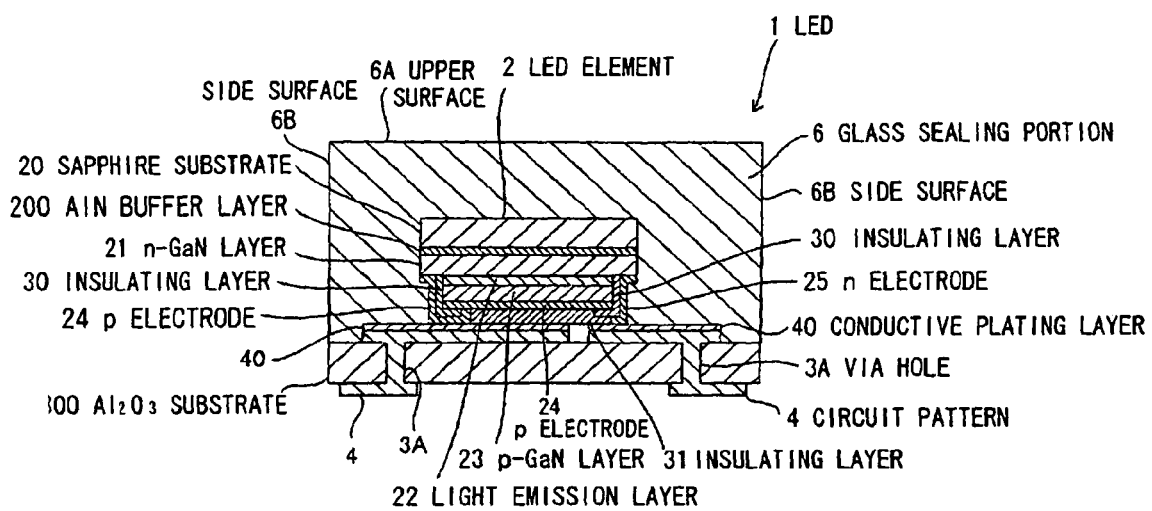
FIG. 3 is a cross-sectional view illustrating an LED as a solid state device according to a third embodiment of the invention.

FIG. 3 is a cross-sectional view illustrating an LED as a solid state device according to a third embodiment of the invention.

This LED 1 is different from that of the first embodiment in that, to make possible electrical connection on the element side surfaces and surface mounting on the semiconductor layer side, an LED element 2 with a p-electrode 24 and an n-electrode 25 formed so as to be exposed to element edges from the element side surfaces to p-contact layer 240 surface are mounted on a circuit pattern 4 provided on an $Al_2O_3$ substrate 300 (thermal expansion coefficient: $7 \times 10^{-6}$/° C.), and sealed with a glass sealing portion 6 made of $SiO_2$—$Nb_2O_5$-based low melting point glass. Here, the term "element edges" refers to edges of side surfaces of the LED element 2, and GaN-based semiconductor layer mounting surface formed in an insulating layer 31, as shown in FIG. 3.

The LED element 2 comprises an AlN buffer layer 200, an n-GaN layer 21, a light-emitting layer 22, a p-GaN layer 23, and a p-contact layer 240 for diffusing current into the p-GaN layer 23, which are sequentially stacked on a sapphire substrate 20, a light-transmitting insulating layer 30 on the side surfaces of the GaN-based semiconductor layer, an n-electrode 25 formed on the n-GaN layer 21 exposed by etching and removing the region extending from the p-GaN layer 23 to a portion of the n-GaN layer 21, a p-electrode 24 provided on the side surfaces of the GaN-based semiconductor layer extending from the AlN buffer layer 200 on the sapphire substrate 20 to the p-contact layer 240, and a light-transmitting insulating layer 31 for covering the element surface extending from the n-electrode 25 to the p-electrode 24.

The $Al_2O_3$ substrate 300 has a thin-film conductive plating layer 40 made of solder formed by electroplating the surface of the circuit pattern 4.

The fabrication process for this LED 1 is explained below.

First, the conductive plating layer 40 is formed by solder electroplating on the surface of the circuit pattern 4 that is provided on the $Al_2O_3$ substrate 300 for serving as an element mounting surface.

Next, the LED element 2 is positioned so that the formation surface of the insulating layer 31 comes into close contact with a specified position on the circuit pattern 4. Next, the $Al_2O_3$ substrate 300 with the LED element 2 positioned thereon is put and heated in a reflow furnace. This heating allows the conductive plating layer 40 to fuse so that the mounting surfaces of the p-electrode 24 and n-electrode 25 are soldered to the element-mounting surface of the circuit pattern 4 on substantially the same plane.

Next, an $SiO_2$—$Nb_2O_5$-based low melting point glass board is set parallel to the LED-element 2-mounted $Al_2O_3$ substrate 300, followed by hot pressing at a temperature of 500° C. in nitrogen atmosphere. The viscosity of the low melting point glass in this condition is $10^8$-$10^9$ poises, and the low melting point glass is bonded to the $Al_2O_3$ substrate 300 via the oxides contained therein.

Next, the $Al_2O_3$ substrate 300 integral with the low melting point glass is set and diced in a dicer into the LED 1 separately.

The effects of the third embodiment are as follows.

(1) Since the LED element 2 with the p-electrode 24 and n-electrode 25 exposed from the mounting surface to the side surfaces is mounted so as to come into contact with the circuit pattern 4, glass penetration to the mounting surface is blocked during glass sealing, thereby allowing obtaining effective joining area. This allows heat caused by light emission of the light emitting layer 22 to be promptly thermally conducted to the $Al_2O_3$ substrate 300, thus allowing enhancement in thermal dissipation.

(2) Since the p-electrode 24 and n-electrode 25 are joined to the circuit pattern 4 via the conductive plating layer 40 made of solder, no solder adheres to portions other than the electrodes, thus allowing prevention of a decrease in electrical connection characteristics due to leak current.

(3) Because of the surface mounting of the LED element 2 with the electrodes formed so as to be exposed to element edges, the occupation ratio of light emitting area to the entire element can be large, thus allowing ensuring high brightness.

(4) Since the solder is made in a thin film shape by plating, the spacing between the p-electrode 24 and n-electrode 25 can be narrow, and there can be a less incidence of short-circuiting.

In the third embodiment, although the LED 1 has the LED element 2 with the electrodes exposed to element edges, the LED element 2 explained in the first embodiment may be joined to the circuit pattern 4 via the conductive plating layer 40. In this case, because of no solder penetration into portions other than mounting surface, no decrease is caused in electrical characteristics due to leak current.

Also, in the case of use of the LED element 2 explained in the first embodiment, the insulating layer 30 for preventing a short-circuit of the p-electrode 24 and n-electrode 25 may be omitted Embodiment 4

Figure 4:
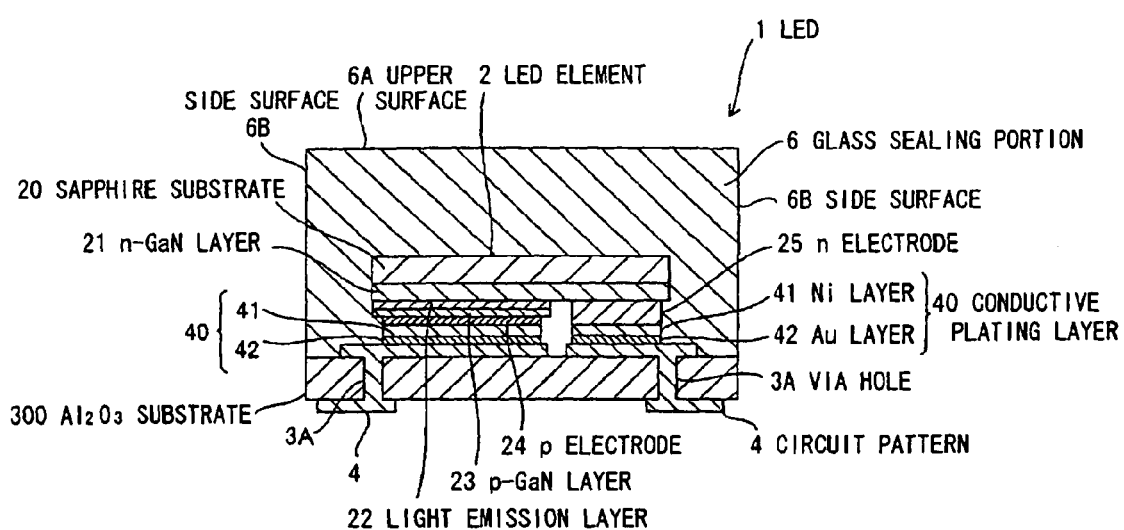
FIG. 4 is a cross-sectional view illustrating an LED as a solid state device according to a fourth embodiment of the invention.

FIG. 4 is a cross-sectional view illustrating an LED as a solid state device according to a fourth embodiment of the invention;

This LED 1 is different from that of the third embodiment in structure having an LED-element 2 on the order of light emission peak wavelength 380 nm, and a conductive plating layer 40 made of an Ni layer 41 and an Au layer 42 formed on a p-electrode 24 and n-electrode 25 of the LED-element 2.

The conductive plating layer 40 is constructed by forming a 20 μm thick Ni-layer 41 on the surfaces of the p-electrode 24 and n-electrode 25, and forming thereon an Au layer 42 by flash plating. This conductive plating layer 40 allows the Au layer 42 to be fused by thermocompression bonding combined with ultrasound so that the mounting surfaces of the p-electrode 24 and n-electrode 25 are joined to the element-mounting surface of the circuit pattern 4 on substantially the same plane.

The effects of the fourth embodiment are as follows.

(1) Since the conductive plating layer 40 consists of Ni and Au, the conductive plating layer 40 fused during mounting the LED-element 2 cannot again be fused by heat during glass sealing, and the LED-element 2 once fixed is thereby not shifted in position during glass sealing so that the fixed state is stable, thus allowing ensuring enhancement in sealing and reliability.

(2) Since light of the order of 380 nm emitted from the LED element 2 is sealed by the glass sealing portion 6 with durability, there can easily be materialized a near-ultraviolet light LED 1 with light-emission characteristics which is stable over a long period of time.

(3) If the temporal bonding is possible during mounting the LED-element 2, the subsequent glass sealing allows the joining of the LED-element 2 and the $Al_2O_3$ substrate 300 to be ensured by compressive stress. This is because of the shape effect of positioning the LED-element 2 in the middle of a solid-state device, in the case of the thermal expansion coefficient of the glass sealing portion 6 being equal to as well as larger than that of the LED-element 2. It should be noted that, in case of the thermal expansion coefficient of the glass sealing portion 6 being 4 times or more that of the LED-element 2, cracking is caused in the glass, depending on the size of the LED-element 2 and the material properties of the glass.

Embodiment 5

Figure 5:
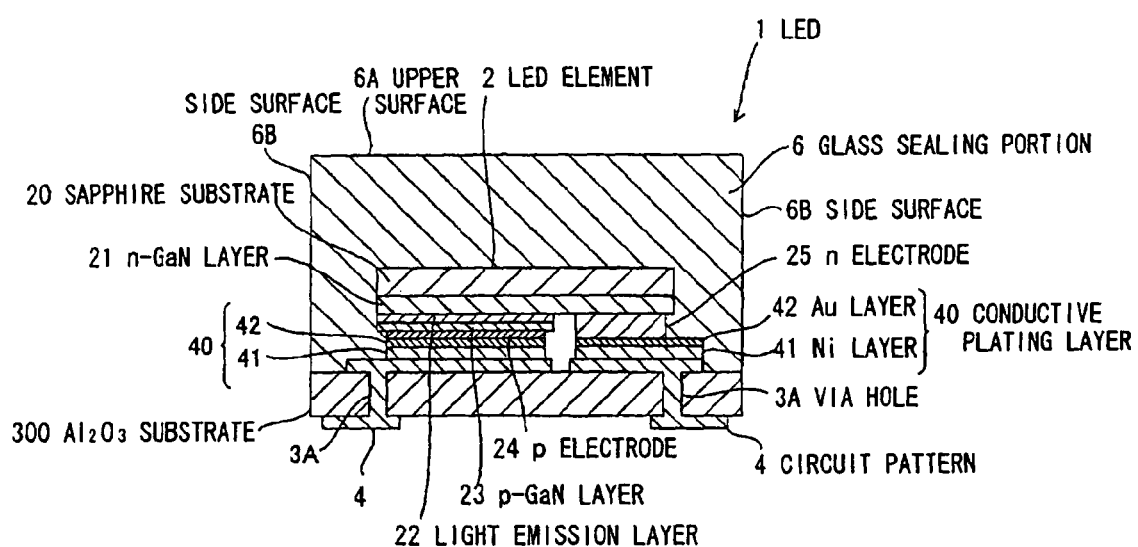
FIG. 5 is a cross-sectional view illustrating an LED as a solid state device according to a fifth embodiment of the invention.

FIG. 5 is a cross-sectional view illustrating an LED as a solid state device according to a fifth embodiment of the invention.

This LED 1 is different from that of the fifth embodiment in structure having on the element-mounting surface of the circuit pattern 4 the conductive plating layer 40 explained in the fourth embodiment.

The effects of the fifth embodiment are as follows.

Since the mounting surfaces of the p-electrode 24 and n-electrode 25 are joined to the element-mounting surface of the circuit pattern 4 on substantially the same plane by thermocompression bonding combined with ultrasound without forming the conductive plating layer 40 on the LED-element 2, stable element fixation can be realized without plating the existing LED-element 2, allowing ensuring enhancement in sealing and reliability, in addition to the favorable effects of the fourth embodiment.

Embodiment 6

Figure 6:
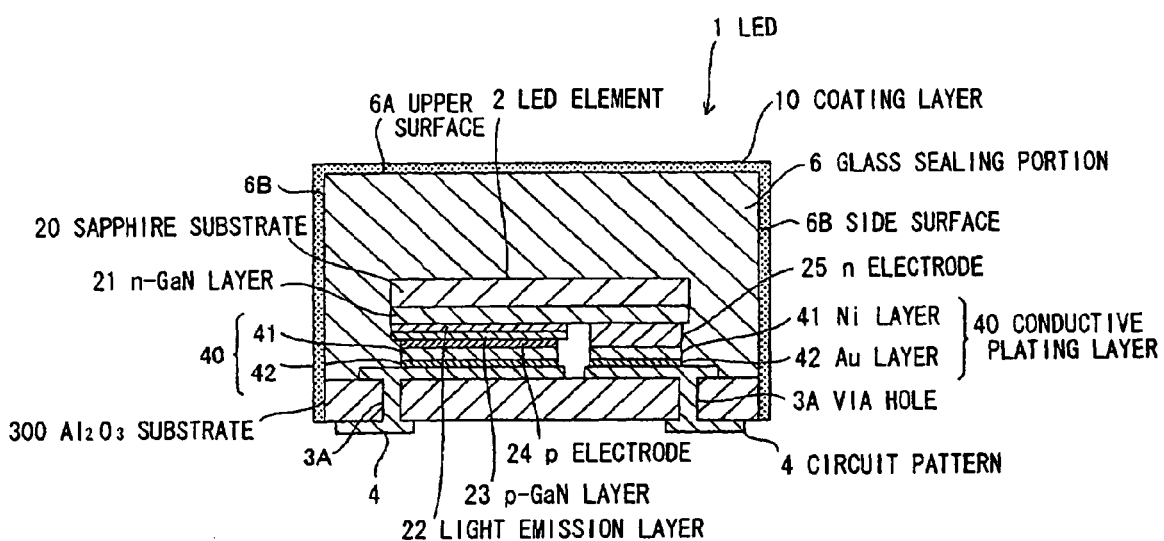
FIG. 6 is a cross-sectional view illustrating an LED as a solid state device according to a sixth embodiment of the invention.

FIG. 6 is a cross-sectional view illustrating an LED as a solid state device according to a sixth embodiment of the invention.

This LED 1 is different from that of the fourth embodiment in structure having a coating layer 10 made of $TiO_2$ having anatase structure on the surface of the glass sealing portion 6 of the LED 1 explained in the fourth embodiment, where organics in air are captured and decomposed by optical catalytic action of $TiO_2$ excited by light of the order of 380 nm peak wavelength radiated from the LED element 2.

The effects of the sixth embodiment are as follows.

Since the coating layer 10 is formed over the glass sealing portion 6, and $TiO_2$ constituting the coating layer 10 is therefore uniformly irradiated with light radiated from the LED element 2, thereby allowing enhancement in optical catalytic action. Also, in resin sealing, the sealing resin itself of the LED element 2 deteriorates due to optical catalytic action, but since the glass sealing portion 6 is formed of stable inorganic material, the function as an optical catalytic device can be performed without optical deterioration over a long period of time.

The glass sealing portion 6 is stable to light, but there is also material which is made turbid white by moisture caused by organic decomposition adhering to its surface for a long period of time. In this case, in order to prevent this, a light-transmitting MgF coating, for example, may be applied to the surface of the glass sealing portion 6, followed by forming thereover a further coating layer 10.

In the sixth embodiment, although the coating layer 10 is formed as an optical catalytic portion over the surface of the LED 1, an optical catalytic portion made of beads of $TiO_2$ particles and having air permeability between beads may be disposed around the LED 1.

In the above embodiments, although the sealing material of the LED element 2 is glass, a portion of glass may be crystallized and turbid white according to uses, and material is not limited to a glass state, provided that good joining to a power receiving/feeding portion with chemically stable inorganic material is possible.

Also, although the LED using the LED element as the solid state device has been explained, the solid state device is not limited to the LED element, but may be another optical element such as a light-receiving element, solar cell, or the like.

Embodiment 7

Figure 7:
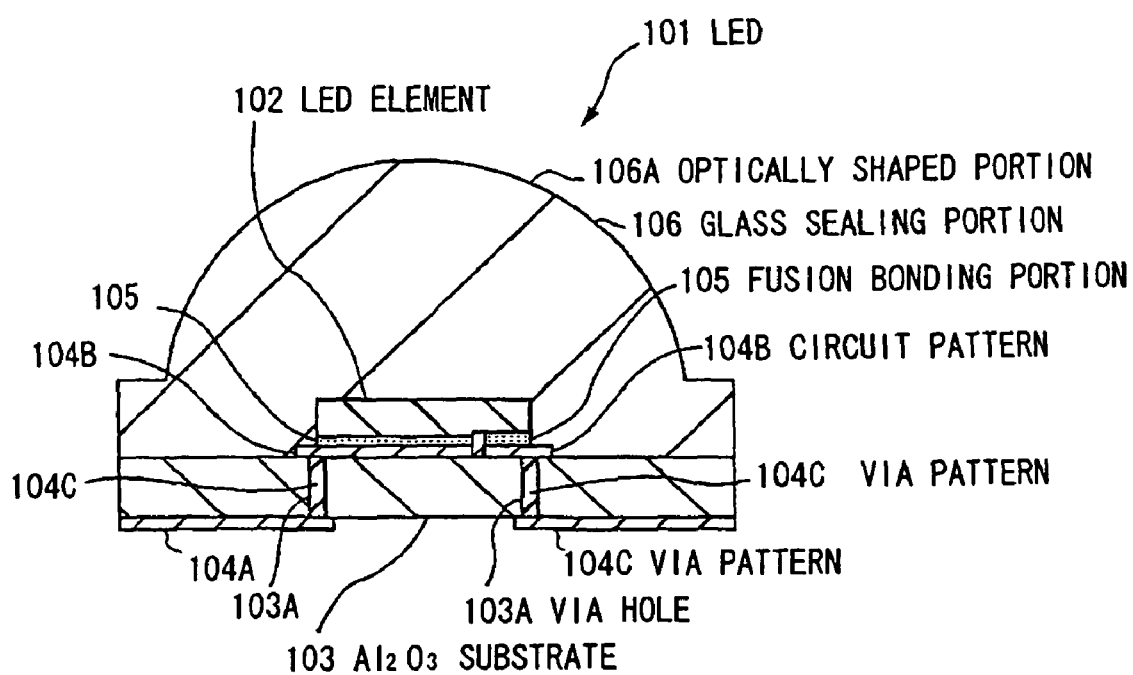
FIG. 7 is a cross-sectional view illustrating an LED according to a seventh embodiment of the invention.

FIG. 7 is a cross-sectional view illustrating an LED according to a seventh embodiment of the invention.

This LED 101 is formed by mounting a plurality of LED elements on a wafer substrate, sealing them from above, thereby forming a plurality of LEDs and cutting them with a dicer.

The LED 101 comprises a flip-chip-type LED element 102 made of a nitride-based compound semiconductor material (thermal expansion coefficient α: $7×10^{-6}/°$ C.), an $Al_2O_3$ substrate 103 as an inorganic material substrate for mounting the LED element 102, circuit patterns 104A and 104B and a via pattern 104C consisting of tungsten (W)-nickel (Ni)-gold (Au) and formed in the $Al_2O_3$ substrate 103 a fusion bonding portion 105 consisting of Ni thick film and Au on the surface of a p-electrode and an n-electrode of the LED element 102, and a glass sealing portion 106 as inorganic sealing material made of transparent glass thermocompression-bonded to the $Al_2O_3$ substrate 103 for sealing the LED element 102.

Figure 8:
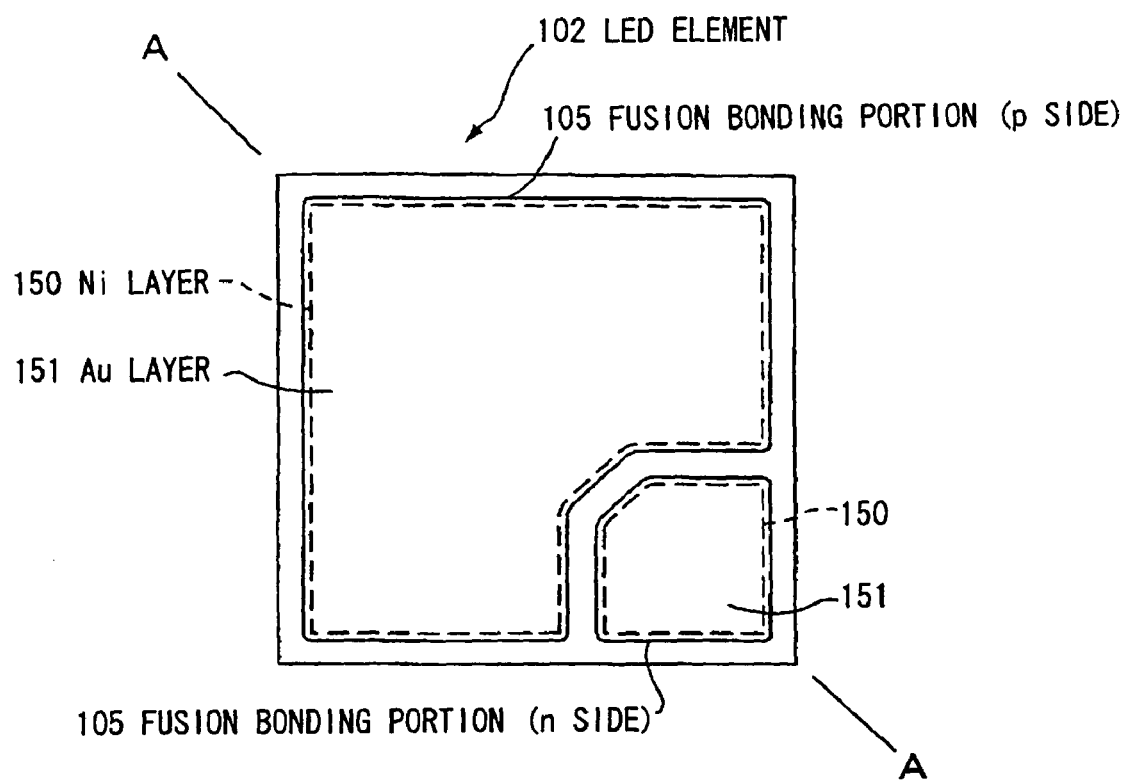
FIG. 8 is a plain view where the LED element according to the seventh embodiment is viewed from electrode formation surface.
Figure 9:
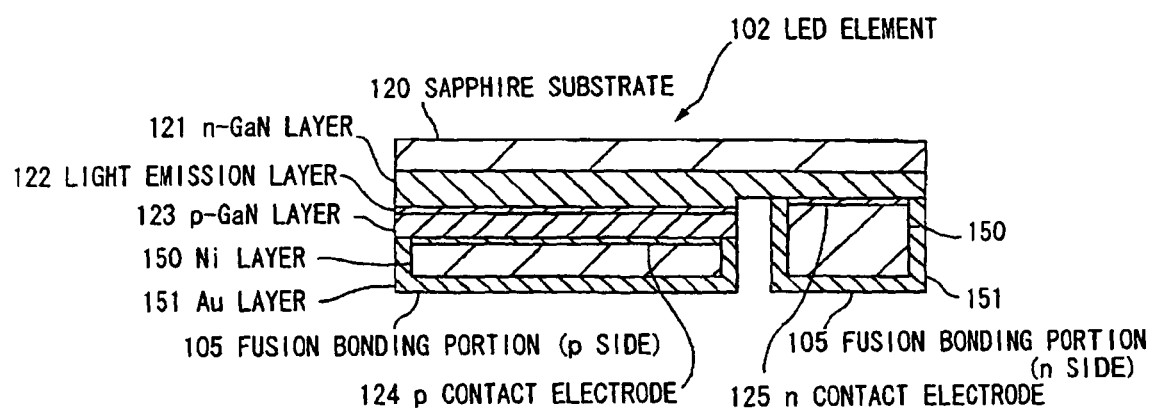
FIG. 9 is a cross-sectional view of the LED element cut along line A-A of FIG. 8.

FIGS. 8 and 9 show the LED element used in the seventh embodiment. FIG. 8 is a plain view where the LED element is viewed from electrode formation surface, and FIG. 9 is a cross-sectional view of the LED element cut along line A-A of FIG. 8.

This LED element 102 has the fusion bonding portion 105 formed according to the shape of the p-electrode and n-electrode as shown in FIG. 8, and, as shown in FIG. 9, has a GaN-based semiconductor layer formed by sequential crystal growth of an n-GaN layer 121, a light-emitting layer 122, and a p-GaN layer 123, via an AlN buffer layer not shown, on a sapphire ($Al_2O_3$) substrate 120

The GaN-based semiconductor layer further has a p-contact electrode 124 formed of rhodium Rh and on the surface of the p-GaN layer 123, and an n-contact electrode 125 formed of V/Al and on the n-GaN layer 121 exposed by dry-etching and removing the region extending from the p-GaN layer 123 to a portion of the n-GaN layer 121, where the fusion bonding portion 105 is integrally formed on the surface of the p-contact electrode 124 and the n-contact electrode 125 by electroless plating.

Here, the n-contact electrode 125 has a necessary and sufficient size capable of low contact voltage to conducting current, and most of the remaining space is the p-contact electrode 124. In other words, portion other than space around the element and spacing in which the p-contact electrode 124 and the n-contact electrode 125 do not short-circuit is occupied by the p-contact electrode 124.

The LED element 102 is 0.34 mm×0.34 mm×thickness 0.09 mm in size, and is epitaxially grown at 700° C. or higher, and has a heat-resistant temperature of 600° C. or higher, and is stable at temperatures at which sealing is performed using low melting point glass, as will be described later. The p-contact electrode 124 is formed of rhodium Rh having current diffusivity and light reflectivity for also serving as a lower reflection mirror for reflecting light emitted from the light-emitting layer 122 in the direction of the sapphire substrate 120.

The $Al_2O_3$ substrate 103 has a thermal expansion coefficient of $7×10^{-6}/°$ C., and has a plurality of via-holes 103A passing through from its front to back side. These via-holes 103A have the via pattern 104C for making the metalized circuit patterns 104A and 104B conductive on the front and back side of the $Al_2O_3$ substrate 103.

The fusion bonding portion 105 comprises an Ni layer 150 formed in a thick film shape by electroless plating on the surface of the p-contact electrode 124 and the n-contact electrode 125, and an Au layer 151 formed by flash plating on the surface of the Ni layer 150 in the fabrication process of the LED element 102, where during joining, the upper surface of the LED element 102 is formed so as to have the height parallel to the surface of the $Al_2O_3$ substrate 103. Also, the Au layer 151 is fused by thermocompression-bonding combined with ultrasound, and thereby joined to the circuit pattern 104B in area according to the shape of the p-contact electrode 124 and the n-contact electrode 125. The Ni layer 150 may have appropriate stiffness as the Au support layer against thermocompression-bonding combined with ultrasound, and may be formed of metal material such as Ag, Cu or the like.

The glass sealing portion 106 is formed of $SiO_2$—$NbO_2$-based low melting point glass (thermal expansion coefficient: $7.0×10^{-6}/°$ C.), and thermocompression-bonded to the $Al_2O_3$ substrate 103 by hot-pressing with a mold. A semi-spherical optically shaped surface 106A is formed on the light derivation side of the glass sealing portion 106 for radiating light radiated from the LED element 102 in a direction based on the optical shape. As the sealing material, it is possible to use resin sealing material such as epoxy resin, silicon resin, etc., in place of inorganic sealing glass.

The low melting point glass is processed with viscosity on several orders of magnitude higher than a viscosity level which is generally said to be high in resin. Also, in the case of glass, its viscosity cannot decrease to a general resin sealing level even if the glass is at temperatures exceeding its yield point by a few ten ° C. For this reason, in glass sealing by hot-pressing of the flip-chip mounted LED element 102, if there is a gap between the LED element 102 and the $Al_2O_3$ substrate 103, there is the possibility of pressurized glass penetrating there halfway, and causing partial peeling of electrodes, which results in an abnormal light-emitting pattern. The electrodes also serve as a reflection film, which radiates light arriving at electrode peeling portion and radiated outwardly from GaN into the air, in a direction different from its original direction.

The fabrication process for this LED 101 is explained below.

First, a glass-containing $Al_2O_3$ substrate 103 having via-holes 103A is prepared, and tungsten (W) paste is screen-printed on the frontside, backside and via-holes 103A of the glass-containing $Al_2O_3$ substrate 103 according to circuit patterns 104A and 104B and a via pattern 104C.

Next, the W-paste-printed $Al_2O_3$ substrate 103 is heated at a little more than 1000° C., thereby burning W into the $Al_2O_3$ substrate 103, followed by Ni and Au plating over W, which results in the formation of circuit patterns 104A and 104B and a via pattern 104C.

Next, an LED element 102 is positioned relative to the circuit pattern 104B. The Au layer 151 of the fusion bonding portion 105 is fused by thermocompression-bonding combined with ultrasound, and thereby joined to the circuit pattern 104B. The LED element 102 is mounted by the fusion bonding portion 105 so that the mounting surface is on substantially the same plane relative to the surface of the circuit pattern 104B.

Next, a low melting point $SiO_2$—$NbO_2$-based glass board is set parallel to the LED-element 102-mounted $Al_2O_3$ substrate 103, followed by hot pressing at a temperature of 500° C. in nitrogen atmosphere. The viscosity of the low melting point glass in this condition is $10^8$-$10^9$ poises, and the low melting point glass is bonded to the $Al_2O_3$ substrate 103 via the oxides contained therein.

Next, the $Al_2O_3$ substrate 103 integral with the low melting point glass is set and diced in a dicer into the LED 101 separately.

There may be used the LED element 102 formed by scribing. In this case, it is preferred to form a V-groove for scribing in the $Al_2O_3$ substrate 103 beforehand, or a mark-off line.

In this LED 101, when connecting the circuit pattern 104A to a power supply not shown to apply voltage, current is caused to flow through the via pattern 104C, the circuit pattern 104B and the fusion bonding portion 105, to the p-contact electrode 124 and the n-contact electrode 125 of the LED element 102, followed by blue light emission of the light emission portion 122, whose light emission wavelength is 450 nm-480 nm. Of blue light emission, light radiated to the sapphire substrate 120 side is passed through the sapphire substrate 120 into the glass sealing portion 106, and radiated in a direction according to optical shape in the interface without side of the optically shaped surface 106A. Also, of blue light emission, light radiated to the p-contact electrode 124 side is reflected in the direction of the sapphire substrate 120 by the p-contact electrode 124, and passed through the sapphire substrate 120 into the glass sealing portion 106, and radiated outwardly via the optically shaped surface 106A.

The effects of the seventh embodiment are as follows.

(1) Since the fusion bonding portion 105 consisting of the thick film Ni layer 150 and Au layer 151 formed on its film in thin film shape is integrally formed in the fabrication process of the LED element 102, the conventional bump forming step can be omitted, thereby allowing enhancement in mass production and realizing low cost. Also, since an inclination of the LED element 102 that is a problem in flip-chip mounting with a stud bump is not caused even without forming 3-point bumps, the mass productivity is excellent.

(2) Since most of space other than the n-contact electrode 125 having necessary and sufficient size is the p contact electrode 124 matching the light emission layer, the occupation ratio of light emission surface to size of the LED element 102 can be large. The GaN-based semiconductor layer (light emission layer) with large heat dissipation is positioned on the mounting side to the sapphire substrate 120. This allows making current density and temperature rise of the light emission layer low, and enhancing light emission efficiency and reliability.

(3) Since the Ni layer 150 and Au layer 151 are formed in substantially the same shape of the p-contact electrode 124 and the n-contact electrode 125 and covering its surface, joining area relative to the circuit pattern 104B can be large, and bonding strength of the LED element 102 can be large, preventing peeling. Also, because of large joining area, heat dissipation from the LED element 102 can be enhanced, handling high power.

(4) Since the LED element 102 is mounted so that mounting surface and the circuit pattern 104B are on substantially the same plane, hot pressing of low melting point glass allows preventing glass from penetrating between the mounting surface and the circuit pattern 4, thus allowing the prevention of a decrease in electrical connection characteristics and of peeling due to glass penetration to the mounting surface, which results in a high-reliability LED 101. Also, an abnormal light emission pattern due to partial electrode peeling can be prevented.

(5) Because of chemical bonding of the $Al_2O_3$ substrate 103 and glass sealing portion 106 via an oxide, firm bonding strength can be obtained. This can materialize glass sealing even in the case of a small package with joining area.

(6) Since the LED element 102, the $Al_2O_3$ substrate 103 and glass sealing portion 106 have the same thermal expansion coefficient, thermal stress due to a thermal expansion coefficient difference can be small during glass sealing, and there is a less incidence of package cracking, and productivity is excellent.

In the seventh embodiment, although the LED 101 uses the LED element 102 made of GaN-based semiconductor material, the LED element 102 is not limited thereto, but may be another LED element such as flip-chip mountable GaAs, GaP-based LED element 102. In particular, in material with high temperature dependency of optical power of an LED element such as AlInGaP, AlGaAs LED element 102, the effect of enhancing thermal dissipation is large.

Also, using a fluorescent material excited by blue light radiated from the LED element 102, there may be used an LED 101 radiating wavelength conversion light such as white light. As such a fluorescent material, there may be used a cerium-activated YAG (Yttrium Aluminum Garnet). The YAG is excited by blue light to produce yellow light, thereby allowing white light to be obtained by complementary color of blue and yellow light. The fluorescent material can uniformly provided by coating the surface of the LED element 102.

Also, a plurality of LED elements 102 having the seventh embodiment structure may be mounted on the substrate for glass sealing.

Also, the light emitting layer may be divided into two, to form LED elements 102 having one n-contact electrode and two p-contact electrode. In this case, for one light emitting layer, there are respectively provided one n-contact electrode and one p-contact electrode, but the n-contact electrode is the common electrode of two light emitting layers. Even if the light emitting layer is not divided, if the p-contact electrode is divided, because the light emitting portion is divided virtually, which is similar to division of the light emitting layer.

Also, in the seventh embodiment, although the fusion bonding portion 105 is formed on the LED element 102, the fusion bonding portion 105-applying target is not limited thereto, but may be a light receiving element, for example.

Embodiment 8

Figure 10:
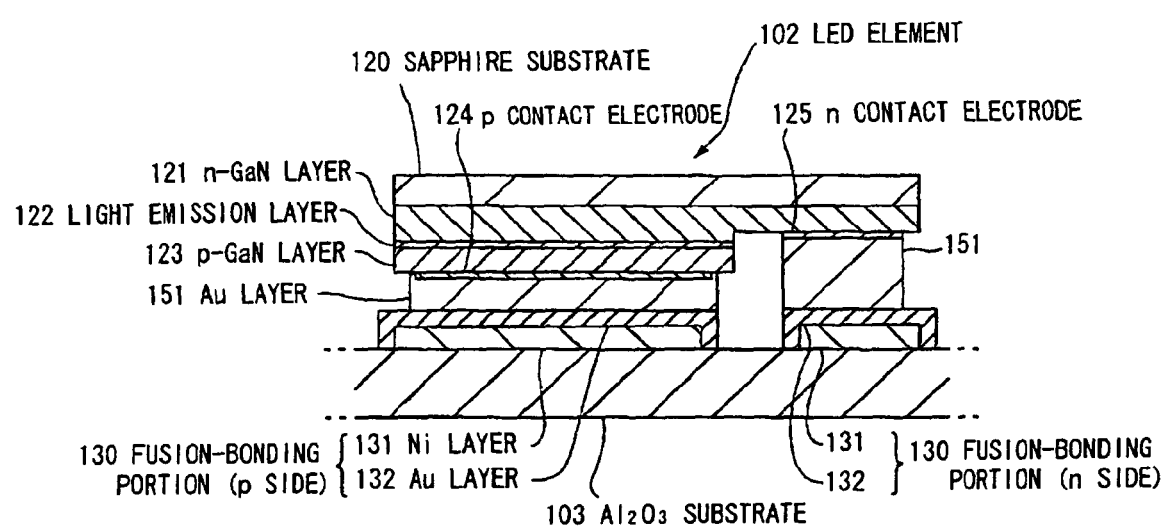
FIG. 10 is an enlarged cross-sectional view illustrating an LED element according to an eighth embodiment of the invention.

FIG. 10 is an enlarged cross-sectional view illustrating an LED element according to an eighth embodiment of the invention. In the following embodiments, the same reference numbers as those of the seventh embodiment respectively denote the portions having the same structure and function as those in the seventh embodiment.

This LED 101 is different from that of the first embodiment in structure having a fusion bonding portion 130 consisting of an Ni layer 131 and an Au layer 132 formed on the $Al_2O_3$ substrate 103 side according to a circuit pattern, and no Ni layer on the p-contact electrode 124 and the n-contact electrode 125 of the LED-element 2.

The effects of the eighth embodiment are as follows.
(1) Even by forming on the $Al_2O_3$ substrate 103 side the fusion bonding portion explained in the seventh embodiment, and thermocompression bonding combined with ultrasound of the Au layer 151 formed on the p-contact electrode 124 and the n-contact electrode 125, and the Au layer 132 of the fusion bonding portion 130, the bump forming step can be omitted as in the seventh embodiment. Also, joining area relative to the circuit pattern can be large, and bonding strength of the LED element 102 can be large, preventing peeling. Also, because of large joining area, heat dissipation from the LED element 102 can be enhanced, handling high power.
(2) Since the fusion bonding portion 130 can be formed without depending on the size of the LED element 102, the fusion bonding portion 130 can easily be formed, and mounting is easily possible on substantially the same plane without requiring high positioning accuracy even in the case of a small LED element 102.
(3) Since the LED element 102 is mounted so that mounting surface and the circuit pattern 104B are on substantially the same plane, hot pressing of low melting point glass allows preventing glass from penetrating between the mounting surface and the circuit pattern 4, thus allowing the prevention of a decrease in electrical connection characteristics and of peeling due to glass penetration to the mounting surface, which results in a high-reliability LED 101. Also, an abnormal light emission pattern due to partial electrode peeling can be prevented.

Embodiment 9

Figure 11A:
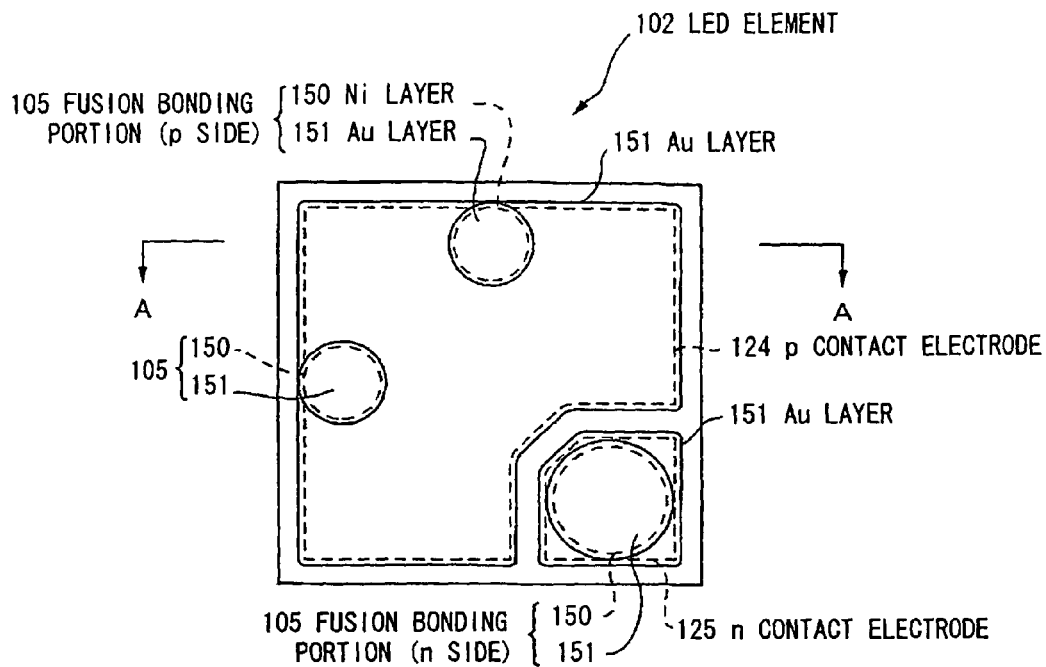
FIG. 11A is a plain view illustrating a fusion-bonded portion of an LED element according to a ninth embodiment of the invention.
Figure 11B:
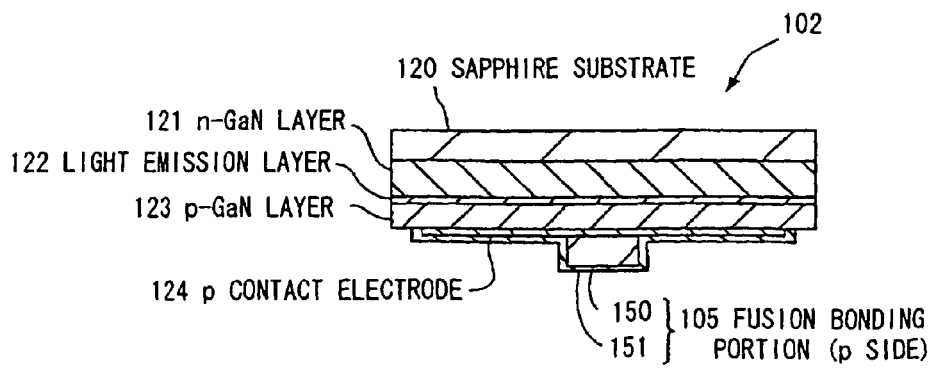
FIG. 11B is a cross-sectional view cut along line A-A of FIG. 11A.

FIG. 11A is a plain view illustrating a fusion-bonded portion of an LED element according to a ninth embodiment of the invention, and FIG. 11B is a cross-sectional view cut along line A-A of FIG. 11A.

This LED element 102 is different from that of the seventh embodiment in structure having a circular fusion bonding portion 105 analogous to a conventional stud bump on the p-contact electrode 124 and the n-contact electrode 125 as shown in FIG. 11A, and having an Au layer on contact electrode surface other than the fusion bonding portion 105 as shown in FIG. 11B. In the same figure, to obtain stability during LED element 102 mounting, two fusion bonding portions 105 are formed on the p-contact electrode 124 and one fusion bonding portion 105 is formed on the n-contact electrode 125, but the fusion bonding portion 105 is possible to be formed without being limited to the number, shape, and arrangement shown.

The effects of the ninth embodiment are as follows.

In element mounting analogous to a conventional stud bump, the conventional bump forming step can be omitted, thereby allowing enhancement in mass production and realizing low cost.

The thermal dissipation and bonding strength are slightly inferior to the seventh embodiment, but quality stability is excellent. That is, because of narrow joining area, ultrasonic power and compression bonding during joining can be the same as conventional.

Also, joining area including the Ni layer 150 is narrow, and peripheral crushed portion can be escaped. Because of 3 point supports, sufficient joining of the 3 point supports can be obtained. Also, the electrode has 2 terminals, but the 3 point supports allow the LED element 102 to be stably arranged.

Embodiment 10

Figure 12A:
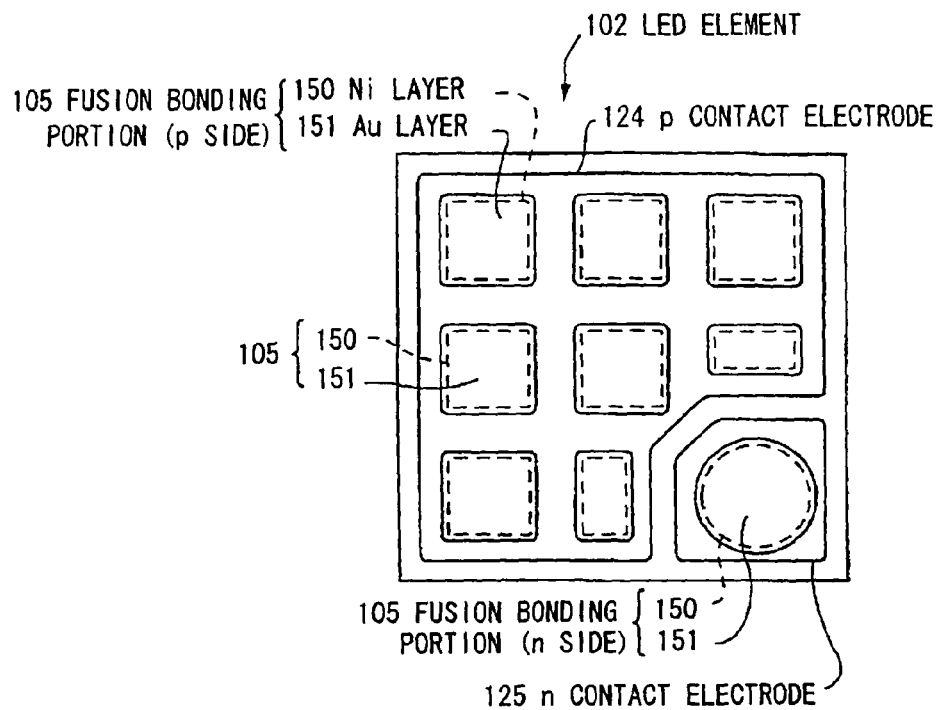
FIGS. 12A and 12B are plain views illustrating a fusion-bonded portion of an LED element according to a tenth embodiment of the invention.
Figure 12B:
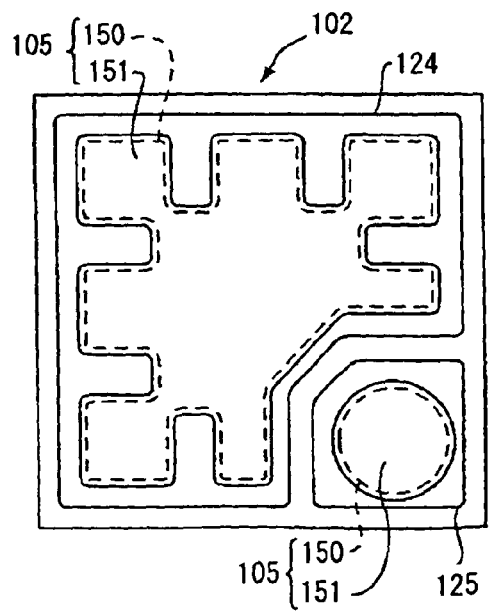

FIGS. 12A and 12B are plain views illustrating a fusion-bonded portion of an LED element according to a tenth embodiment of the invention;

This LED 101 has a plurality of fusion bonding portions 105 in an island form on the p-contact electrode 124 as shown in FIG. 12A.

In the fusion bonding portions 105, when the Au layer 151 is formed on the surface of the Ni-layer 150, thick Au adheres to the peripheral portion of the Ni-layer 150, so that in the case of the large Ni-layer 150, there is concern that the joining state of the Au joining surface can be uneven.

The effects of the tenth embodiment are as follows.
(1) Since the fusion bonding portion 105 with the same electrode is divided into islands in the fabrication process, the Au layer 151 can crush uniformly during thermocompression bonding combined with ultrasound, which results in a uniform joining state. This allows large joining area to be stably ensured, and thermal dissipation can be enhanced as in the seventh embodiment. Also, since the Au layer 151 can crush uniformly, the LED element 102 can be thermocompression bonded stably without being inclined. Also, there is the effect of a less incident of glass penetrating between the mounting surface and the LED element 102. Even if pressurized, because of high glass viscosity, even in the case of no gap at all, there is the effect.

Also, except that the fusion bonding portion 105 is divided into islands, the islands may be connected by cutting a pattern as shown in FIG. 12B. This case can yield similar effects, thereby enhancing thermal dissipation. The cut is not limited to cutting from an end portion, but may be formed inside.

Embodiment 11

Figure 13:
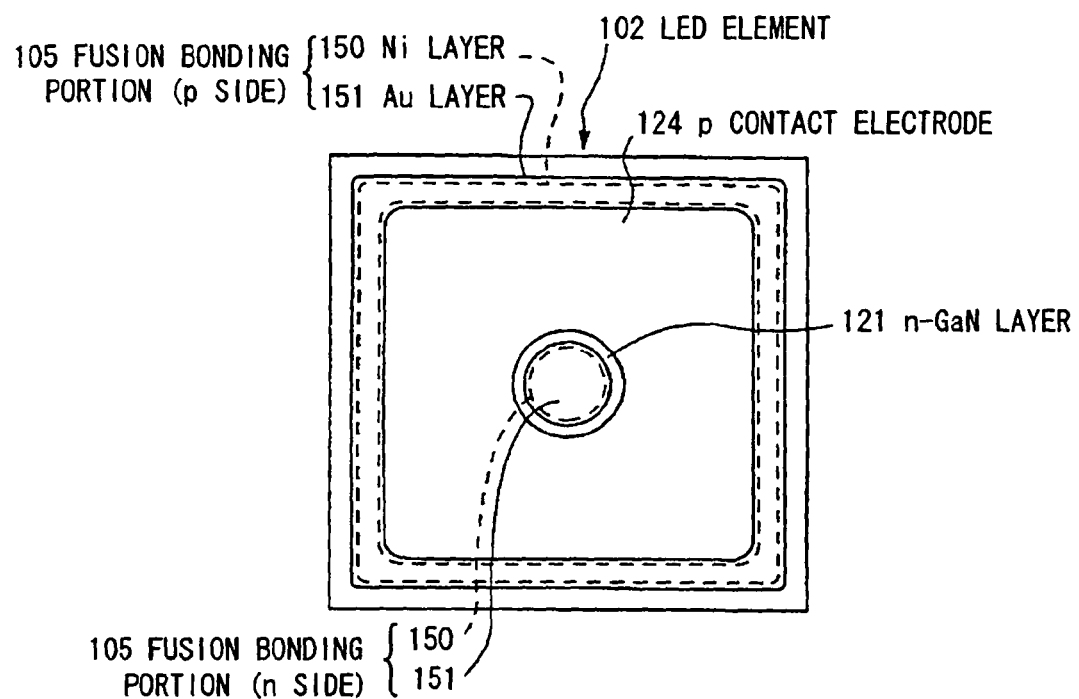
FIG. 13 is a plain view illustrating a fusion-bonded portion of an LED element according to an eleventh embodiment of the invention.

FIG. 13 is a plain view illustrating a fusion-bonded portion of an LED element according to an eleventh embodiment of the invention This LED element 102 is different from that of the seventh embodiment in structure having the fusion bonding portion 105 explained in the seventh embodiment, formed on the n-contact electrode 125 provided at the center of the LED-element 2, and annularly along the peripheral portion of the p-contact electrode 124.

The n-side fusion bonding portion 105 has the n-GaN layer 121 exposed by dry-etching the GaN-based semiconductor layer at the center of the LED-element 2, an n-contact electrode formed on the exposed portion of the n-GaN layer 121, an Ni-layer 150 thereon formed in a thick film shape, and an Au layer 151 subsequently formed, which is thereby formed smaller than the n-side fusion bonding portion 105 explained in the seventh embodiment The effects of the eleventh embodiment are as follows.
(1) Since the n-side fusion bonding portion 105 is made small at the center of a light emission region, and p-side fusion bonding portion 105 is formed annularly in the peripheral portion, the area of the p-contact electrode 124 relative to the light emitting layer 122 of the LED-element 2 can be enlarged, enhancing current diffusivity to the p-GaN layer 123. Namely, the occupation ratio of the light emission region of the LED-element 2 is made large, thereby realizing high brightness.
(2) The p-side fusion bonding portion 105 is formed annularly around the p-contact electrode 124, the sealing material can be prevented from penetrating into the inner side than p-side fusion bonding portion 105, thus allowing the prevention of electrode damage and a decrease in electrical connection characteristics and of peeling due to glass penetration between the LED element 102 and the circuit pattern. Since the bonding strength of the LED element 102 can be large, there is a less incidence of peeling and high-reliability flip-chip mounting is possible. There is a less incidence of abnormal light emission pattern.

AS explained in the seventh embodiment, in the case of use of sealing glass, at high temperatures, no stress is caused in the peeling direction of the sealing portion, no high bonding strength is required for sealing with sealing resin. For that, the p-side fusion bonding portion 105 is not entirely but partially annular, thereby obtaining practical bonding strength.

Embodiment 12

Figure 14:
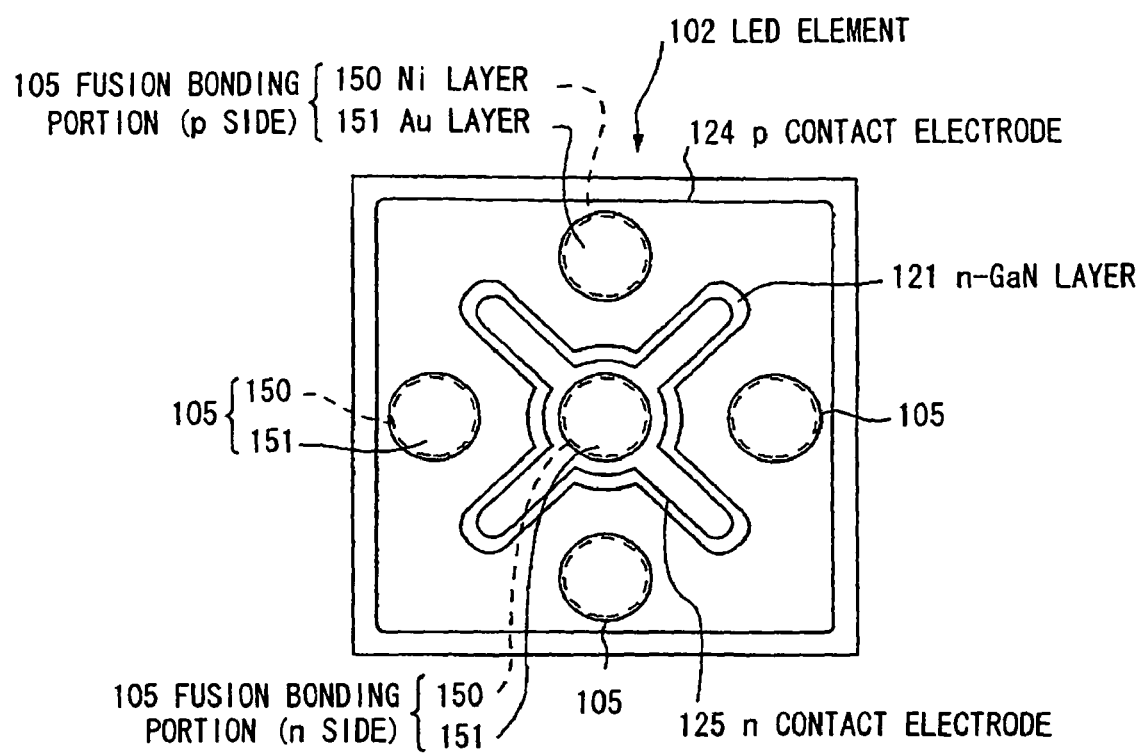
FIG. 14 is a plain view illustrating a fusion-bonded portion of an LED element according to a twelfth embodiment of the invention.

FIG. 14 is a plain view illustrating a fusion-bonded portion of an LED element according to a twelfth embodiment of the invention.

This LED element 102 is different from that of the eleventh embodiment in structure having the n-side fusion bonding portion 105 provided at the center of the LED-element 102, the 10 μm wide n-contact electrode 125 radially formed for being electrically connected to the n-side fusion bonding portion 105, 4-point p-side fusion bonding portion 105 formed on the p-contact electrode 124.

The effects of the twelfth embodiment are as follows.

In addition to the favorable effects of the seventh and eleventh embodiments, the n-contact electrode 125 radially formed from the center of the LED-element 102 allows enhancement in current diffusivity. Further, the n-contact electrode 125 can be as thin as 20 μm or less in width because of no thick film Ni layer 150. The current diffusivity can be enhanced without significantly decreasing the area of the p-contact electrode 124 which serves as light emission area.

As explained in the eleventh embodiment, the p-side fusion bonding portion 105 may be formed annularly around the p-contact electrode 124, thus allowing the prevention of electrode damage and a decrease in electrical connection characteristics.

Embodiment 13

Figure 15:
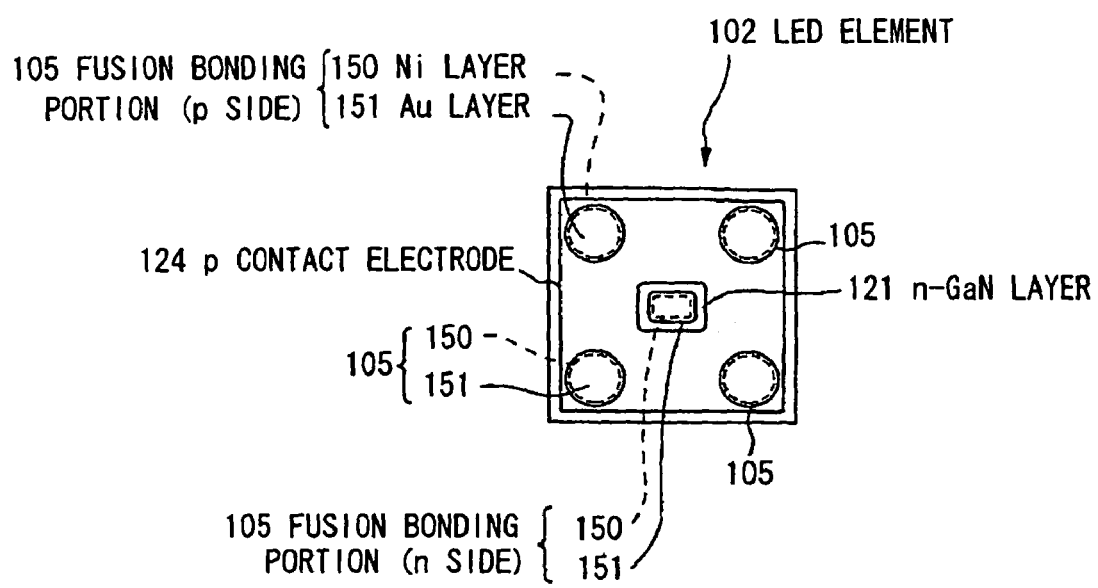
FIG. 15 is a plain view illustrating a fusion-bonded portion of an LED element according to a thirteenth embodiment of the invention.

FIG. 15 is a plain view illustrating a fusion-bonded portion of an LED element according to a thirteenth embodiment of the invention.

This LED element 102 is different from that of the eleventh in structure using a smaller-size LED element 102 (0.2 mm×0.2 mm) compared to the LED element 102 explained in the seventh to twelfth embodiment, and having an n-side fusion bonding portion 105 provided at the center of the LED-element 102, as in the eleventh embodiment, and a p-side fusion bonding portion 105 provided at 4 corners of the p-contact electrode 124. The n-side fusion bonding portion 105 is formed at a size ratio to the entire area of the LED element 102 which does not degrade light emission efficiency.

The effects of the thirteenth embodiment are as follows.

Since the n-side fusion bonding portion 105 matching the size of the LED-element 102 is formed at the center of the LED-element 102, in addition to the favorable effects of the twelfth embodiment, a small-size but high-brightness LED-element 102 can be obtained without significantly decreasing the occupation ratio of the light emission area to the LED-element 102. 70% of blue light produced by the light emission layer 122 of the GaN-based LED-element 102 is lateral propagation light within the GaN-based semiconductor layer, so light cannot be radiated outwardly. Also, light derivation efficiency is degraded due to an increase in lateral propagation distance, and absorption by repeated reflection at the reflection surface.

Namely, by making the LED-element 102 small, the lateral propagation distance shortening and the number of reflection can be reduced. As explained in this embodiment, when the GaN-based LED-element 102 is formed with 0.2 mm×0.2 mm, light derivation efficiency is enhanced by 20%, compared to the LED-element 102 formed with 0.34 mm×0.34 mm explained in the seventh embodiment. Also, when the GaN-based LED-element 102 is formed with 0.1 mm×0.1 mm, light derivation efficiency is enhanced by 40%.

Also, in the thirteenth embodiment, as explained in the eleventh embodiment, the p-side fusion bonding portion 105 may be formed annularly around the p-contact electrode 124.

Embodiment 14

Figure 16:
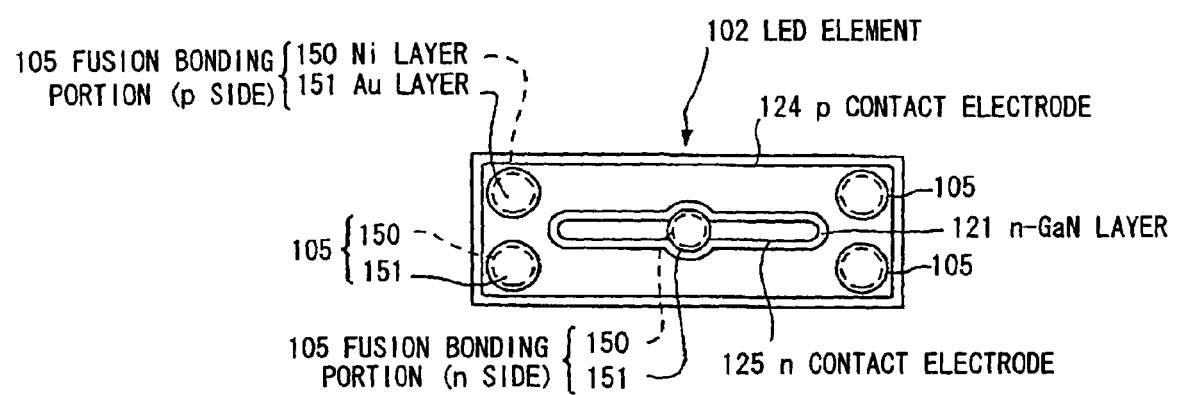
FIG. 16 is a plain view illustrating a fusion-bonded portion of an LED element according to a fourteenth embodiment of the invention.

FIG. 16 is a plain view illustrating a fusion-bonded portion of an LED element according to a fourteenth embodiment of the invention.

This LED element 102 is different from that of the twelfth in structure forming a rectangular LED element 102 (0.1 mm×0.34 mm) and having an n-side fusion bonding portion 105 provided at the center of the LED-element 102, an n-contact electrode 125 formed longitudinally for being electrically connected to the n-side fusion bonding portion 105, and a p-side fusion bonding portion 105 provided at 4 corners of the p-contact electrode 124.

The effects of the fourteenth embodiment are as follows.

Even in the case of the rectangular LED-element 102, a small-size and high-brightness LED-element 102 can be obtained by having high current diffusivity without significantly decreasing the occupation ratio of the light emission area to the LED-element 102.

Embodiment 15

Figure 17A:
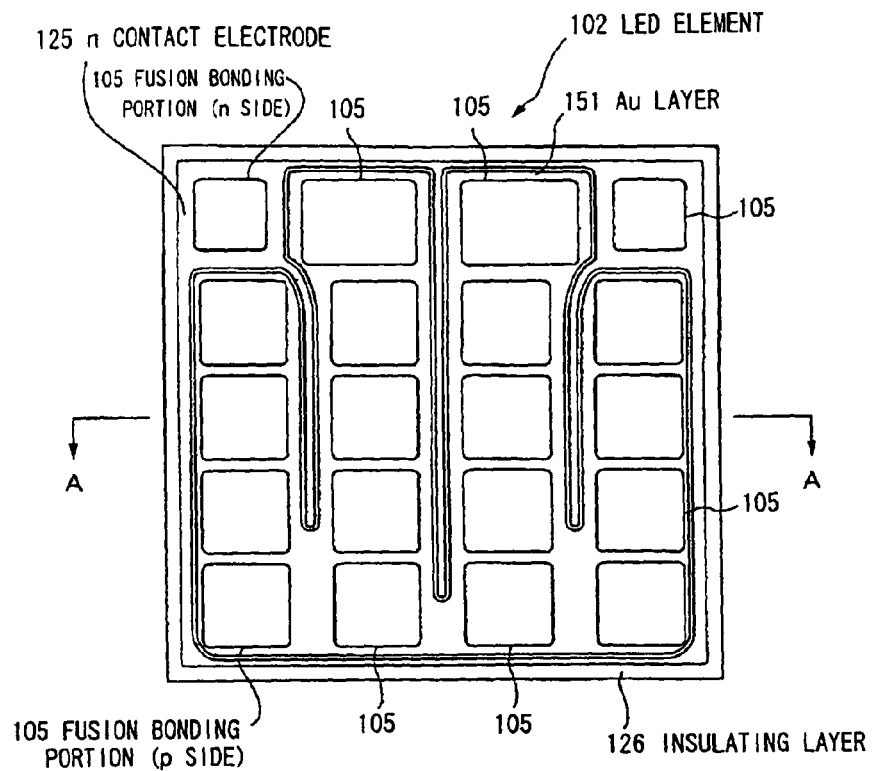
FIG. 17A is a plain view illustrating a fusion-bonded portion of an LED element according to a fifteenth embodiment of the invention.
Figure 17B:
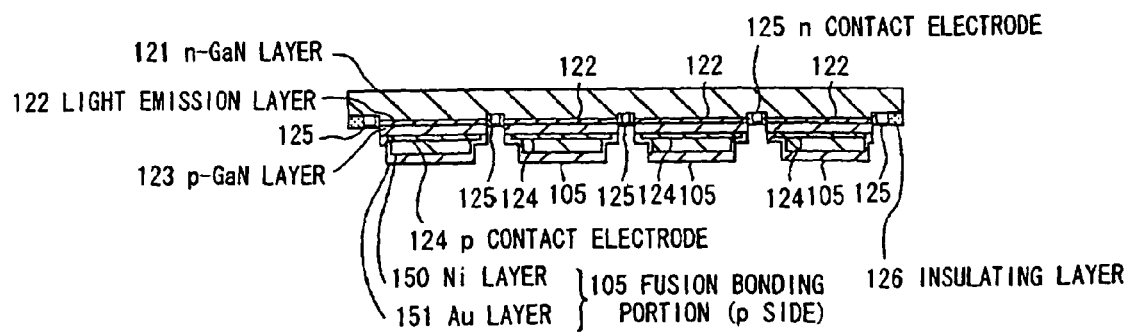
FIG. 17B is a cross-sectional view cut along line A-A of FIG. 17A.

FIG. 17A is a plain view illustrating a fusion-bonded portion of an LED element according to a fifteenth embodiment of the invention, and FIG. 17B is a cross-sectional view cut along line A-A of FIG. 17A.

Figure 18:
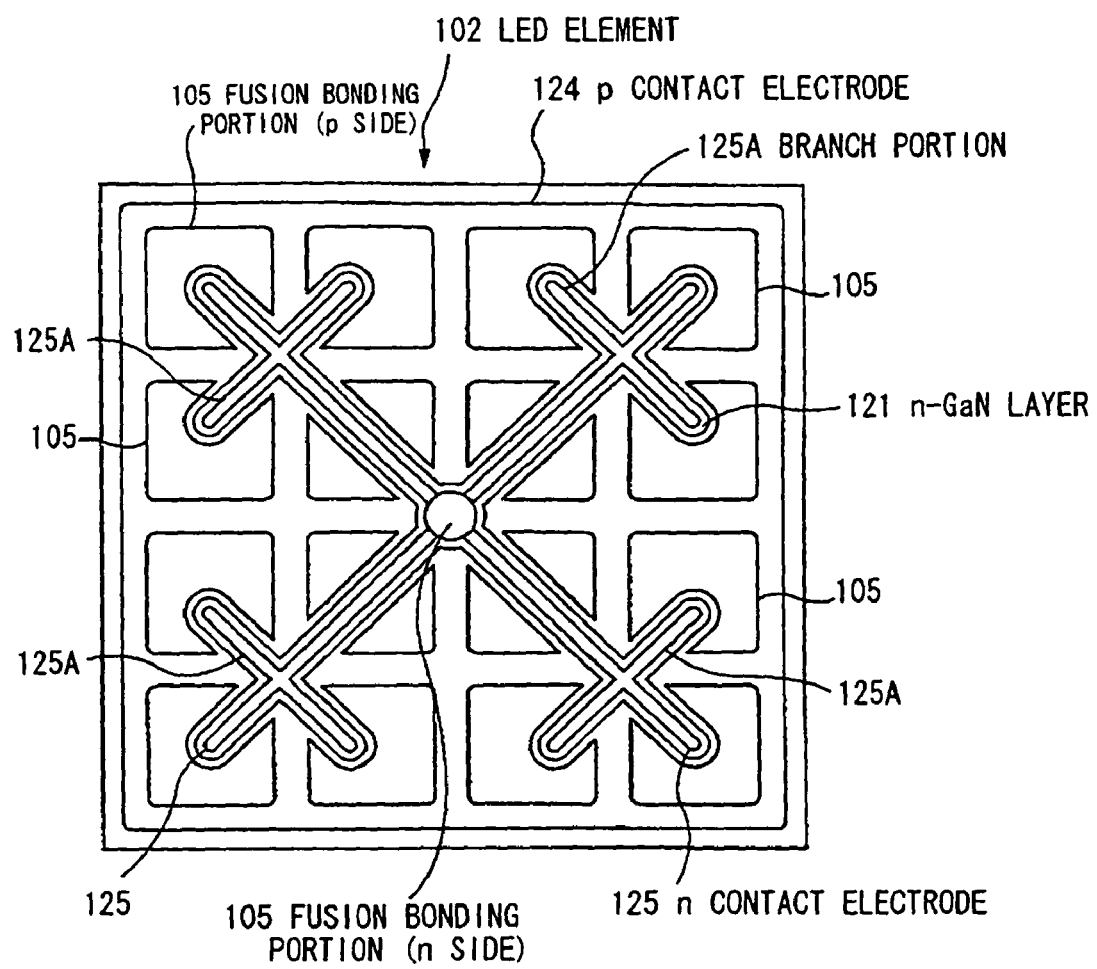
FIG. 18 is a plain view illustrating a fusion-bonded portion of an LED element according to a sixteenth embodiment of the invention.

This LED element 102 is different from that of the eleventh embodiment in structure forming p-side and n-side fusion bonding portion 105 on a large-size LED element 102 (1 mm×1 mm), and as shown in FIG. 17A, 18 p-side fusion bonding portions 105 in the formation region of the p-contact electrode 124, and 2 n-side fusion bonding portions 105 outside the formation region of the p-contact electrode 124.

In FIG. 17A, an $SiO_2$ insulating layer 126 is formed in a portion except for the formation region of the p-side and n-side fusion bonding portion 105 and the formation region of the p-contact electrode 124. In the underlying n-GaN layer 121 of the insulating layer 126, an n-contact electrode 125 is provided for being electrically connected to the n-side fusion bonding portion 105 as shown in FIG. 17B. Also, this LED element 102 has the n-GaN layer 121 exposed by laser-lifting-off the sapphire substrate provided as a base during formation.

The effects of the fifteenth embodiment are as follows.

(1) In the multipoint joining with stud bumps of the large-size LED element 102, the multipoint-joining-type element can easily be formed without requiring time-consuming provision of a plurality of stud bumps with good shape accuracy, which allows ensuring realization of cost reduction and enhancement in mounting property by reducing process steps.

(2) Since for heat produced by light emission of the large-size LED element 102, the arrangement and shape of fusion-bonding portion with excellent thermal dissipation can be selected without losing current diffusivity, both uniform light emission and high thermal dissipation can be obtained. Although the LED element 102 is 1 mm×1 mm in size, thermal dissipation has to be taken into account even in 0.6 mm×0.6 mm size, and this structure is effective.

(3) In laser-lift-off of the sapphire substrate, in stud bump mounting, to prevent cracking of the GaN-based semiconductor layer, action, such as underfilling between the circuit pattern and the electrode formation surface of the LED element 102, has to be taken which increases the number of the underfilling step, but in the fifteenth embodiment, since substantially the entire area of the GaN-based semiconductor layer is supported by the fusion bonding portions 105, it is possible to laser-lift-off the sapphire substrate without underfilling.

Embodiment 16

FIG. 18 is a plain view illustrating a fusion-bonded portion of an LED element according to a sixteenth embodiment of the invention.

This LED element 102 has an n-side fusion bonding portion 105 at the center of the large-size LED-element 102 explained in the fifteenth embodiment, and an n-contact electrode 125 formed diagonally in a cross shape for being electrically connected to the fusion bonding portion 105. This n-contact electrode 125 has a branch portion 125A formed for enhancing current diffusivity.

Also, on the p-contact electrode 124, there are arranged 16 square p-side fusion bonding portions 105 from which are removed portions crossing the n-contact electrode 125.

The effects of the sixteenth embodiment are as follows.

(1) In addition to the favorable effects of the fifteenth embodiment, the p-side fusion bonding portions 105 can be formed without being limited by the shape and arrangement of the n-side fusion bonding portion 105 and the n-contact electrode 125, which results in a large-size LED 102 which is excellent in current diffusivity and thermal dissipation.

Also, in the fifteenth embodiment, thermal distribution is asymmetrical on the upper and lower side of the drawing, so that during sealing with large thermal expansion coefficient silicon resin, stress in the peeling direction to the LED element 102 is not entirely but partially uniform, which tends to cause electrical breaking, but in the sixteenth embodiment, thermal distribution is symmetrical on the upper and lower side and on the right and left side of the drawing, so that stress is caused entirely uniformly, which has a less incidence of electrical breaking.

The above LED element 102 may, for example, be flip-chip mounted on a submount made of Si, for example, followed by being mounted on a lead and subsequently sealed with resin sealing material, such as silicon resin and epoxy resin, which results in an LED 1. In this case, a fluorescent material may be mixed into the resin sealing material to form a wavelength conversion type LED 101.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light-emitting element, comprising:
p and n contact electrodes formed on a flip-chip mounting surface of the light-emitting element corresponding to one light-emitting layer of the light-emitting element; and
a fusion-bonding portion formed on the p and n contact electrodes corresponding to the p and n contact electrodes, for being directly fusion-bonded to an external mounting pattern,
wherein the fusion-bonding portion comprises a plurality of fusion-bonding portions electrically connected to the same polarity electrode, and
wherein the fusion-bonding portion comprises a thick support layer, and a fusion-bonding layer formed on the thick support layer and having a thickness less than a thickness of the thick support layer, said fusion-bonding layer abutting side surfaces of the p and n contact electrodes, and said thick support layer abutting bottom surfaces of the p and n contact electrodes.

2. The light-emitting element according to claim 1, wherein a portion of said light-emitting element comprising said p contact electrode is greater than a portion of said light-emitting element comprising said n contact electrode.

3. The light-emitting element according to claim 1, wherein the p-contact electrode serves as a reflection mirror.

4. The light-emitting element according to claim 1, wherein the n contact electrode is formed at a central portion of the light-emitting element.

5. The light-emitting element according to claim 1, wherein the fusion-bonding layer formed on the p and n contact electrodes has substantially a same plane such that an upper surface of the light-emitting element is parallel to a surface of a mounting substrate upon a mounting of the light-emitting element.

6. The light-emitting element according to claim 1, wherein the fusion-bonding portion abuts the flip-chip mounting surface of the light-emitting element.

7. The light-emitting element according to claim 1, wherein an upper surface of the fusion-bonding portion is co-planar with an upper surface of the p and n contact electrodes.

* * * * *